United States Patent
Snodgrass et al.

(10) Patent No.: US 10,733,099 B2
(45) Date of Patent: Aug. 4, 2020

(54) BROADENING FIELD SPECIALIZATION

(71) Applicants: DATAWARE VENTURES, LLC, Tucson, AZ (US); ARIZONA BOARD OF REGENTS ON BEHALF OF THE UNIVERSITY OF ARIZONA, Tucson, AZ (US)

(72) Inventors: Richard T. Snodgrass, Tucson, AZ (US); Saumya K. Debray, Tucson, AZ (US); Rui Zhang, Redondo Beach, CA (US); Yang Liu, Tucson, AZ (US)

(73) Assignees: ARIZONA BOARD OF REGENTS ON BEHALF OF THE UNIVERSITY OF ARIZONA, Tucson, AZ (US); DATAWARE VENTURES, LLC, Tucson, AZ (US)

( * ) Notice: Subject to any disclaimer, the term of this patent is extended or adjusted under 35 U.S.C. 154(b) by 0 days.

(21) Appl. No.: 16/062,592

(22) PCT Filed: Dec. 14, 2016

(86) PCT No.: PCT/US2016/066665
§ 371 (c)(1),
(2) Date: Jun. 14, 2018

(87) PCT Pub. No.: WO2017/106351
PCT Pub. Date: Jun. 22, 2017

(65) Prior Publication Data
US 2018/0365148 A1    Dec. 20, 2018

Related U.S. Application Data

(63) Continuation-in-part of application No. 14/968,296, filed on Dec. 14, 2015, now Pat. No. 10,365,900.

(51) Int. Cl.
*G06F 9/44* (2018.01)
*G06F 12/0811* (2016.01)
(Continued)

(52) U.S. Cl.
CPC ........... *G06F 12/0811* (2013.01); *G06F 8/36* (2013.01); *G06F 8/443* (2013.01); *G06F 8/72* (2013.01);
(Continued)

(58) Field of Classification Search
CPC .... G06F 12/0811; G06F 16/21; G06F 16/217; G06F 8/36; G06F 8/443; G06F 8/72; G06F 8/75; G06F 9/44521; G06F 12/0804
(Continued)

(56) References Cited

U.S. PATENT DOCUMENTS

| 5,202,995 A | 4/1993 | O'Brien | 395/700 |
| 5,493,675 A | 2/1996 | Faiman | 717/144 |

(Continued)

FOREIGN PATENT DOCUMENTS

| JP | S62274433 | 11/1987 | G06F 17/30 |
| JP | H07234793 | 9/1995 | G06F 9/38 |

(Continued)

OTHER PUBLICATIONS

Adaptive mechanisms and policies for managing cache hierarchies in chip multiprocessors, author: E Speight et al, ACM published on 2005.*

(Continued)

*Primary Examiner* — Chameli Das
(74) *Attorney, Agent, or Firm* — Hayes Soloway P.C.

(57) ABSTRACT

A method to minimize cache pressure using slot pressure profile (SPP)-guided Algorithm includes generating an intermediate SPP from a binary code of a DBMS. The generated intermediate SPP is received and a reference SPP is output. The reference SPP has a value assigned for each cache slot in a cache, whereby a cache slot value is indicative of cache pressure. The reference SPP is accepted and a candidate slot
(Continued)

list related to the cache is produced by sorting the values in the reference SPP. A slot number among the candidate slot list is decided and passed to find an open memory address mapping to the decided slot number for a bee code, the bee code being a specialized version of a DBMS function created and loaded into the cache at run-time. A query with the bee code is executed using the open memory address found.

6 Claims, 14 Drawing Sheets

(51) Int. Cl.
    *G06F 9/445*     (2018.01)
    *G06F 12/0804*     (2016.01)
    *G06F 16/21*     (2019.01)
    *G06F 8/36*     (2018.01)
    *G06F 8/72*     (2018.01)
    *G06F 8/75*     (2018.01)
    *G06F 8/41*     (2018.01)
    *G06F 30/20*     (2020.01)

(52) U.S. Cl.
    CPC ............ *G06F 8/75* (2013.01); *G06F 9/44521* (2013.01); *G06F 12/0804* (2013.01); *G06F 16/21* (2019.01); *G06F 16/217* (2019.01); *G06F 30/20* (2020.01)

(58) Field of Classification Search
    USPC ......................................................... 717/106
    See application file for complete search history.

(56) References Cited

U.S. PATENT DOCUMENTS

| | | |
|---|---|---|
| 5,787,418 A | 7/1998 | Hibbetts |
| 5,842,022 A | 11/1998 | Nakahira et al. ............ 395/709 |
| 5,842,209 A | 11/1998 | Mocek |
| 5,999,924 A | 12/1999 | Bair et al. ........................ 707/4 |
| 6,085,035 A | 7/2000 | Ungar ........................... 395/705 |
| 6,427,234 B1 | 7/2002 | Chambers et al. ........... 717/140 |
| 6,487,713 B1 | 11/2002 | Cohen ...................... G06F 8/34 |
| 6,560,693 B1 | 5/2003 | Puzak et al. .................. 712/207 |
| 6,622,300 B1 | 9/2003 | Krishnaswamy et al. .... 717/130 |
| 6,634,022 B1 | 10/2003 | Leermakers ............ G06F 8/443 |
| 6,925,630 B1 | 8/2005 | Britton ...................... G06F 8/51 |
| 6,961,930 B1 | 11/2005 | Waldspurger ........ G06F 11/3419 |
| 7,039,909 B2 | 5/2006 | Wu et al. ....................... 717/150 |
| 7,131,119 B2 | 10/2006 | Kumar ........................... 717/150 |
| 7,146,352 B2 | 12/2006 | Brundage et al. ................ 707/2 |
| 7,254,810 B2 | 8/2007 | Barsness et al. ............. 717/160 |
| 7,373,641 B2 | 5/2008 | Ogasawara ................... 717/151 |
| 7,730,468 B1 | 6/2010 | Trowbridge ......... G06F 9/44547 |
| 8,032,509 B2 | 10/2011 | Piedmonte .................... 707/708 |
| 8,640,107 B2 | 1/2014 | Jaeger ........................... 717/126 |
| 9,122,523 B2 | 9/2015 | Pienaar |
| 2001/0042240 A1 | 11/2001 | Ng ........................... G06F 8/427 |
| 2002/0147969 A1 | 10/2002 | Lethin et al. .................. 717/138 |
| 2003/0065688 A1* | 4/2003 | Dageville ............. G06F 16/217 |
| 2003/0126151 A1 | 7/2003 | Jung |
| 2003/0145314 A1 | 7/2003 | Nguyen et al. ............... 717/158 |
| 2003/0200537 A1 | 10/2003 | Barsness ....................... 717/151 |
| 2004/0117359 A1 | 6/2004 | Snodgrass et al. ............... 707/3 |
| 2004/0133747 A1 | 7/2004 | Coldewey ..................... 711/137 |
| 2004/0243555 A1 | 12/2004 | Bolsius et al. .................... 707/3 |
| 2005/0050533 A1 | 3/2005 | Koseki .................... G06F 8/441 |
| 2005/0165850 A1* | 7/2005 | Mosescu ............. G06F 16/2246 |
| 2005/0188364 A1 | 8/2005 | Cockx ..................... G06F 8/456 |
| 2005/0192951 A1 | 9/2005 | Day et al. ......................... 707/3 |
| 2006/0026116 A1 | 2/2006 | Day et al. ......................... 707/1 |
| 2006/0036398 A1 | 2/2006 | Funge ....................... G06N 5/02 |
| 2007/0143357 A1 | 6/2007 | Chaudhri .......... G06F 17/30017 |
| 2007/0226698 A1 | 9/2007 | Cascaval et al. ............. 717/127 |
| 2007/0239656 A1 | 10/2007 | Santosuosso ...................... 707/2 |
| 2007/0240135 A1 | 10/2007 | Stoodley et al. ............. 717/140 |
| 2008/0052697 A1 | 2/2008 | Stoodley ............... G06F 9/3851 |
| 2008/0189277 A1 | 8/2008 | Meijer |
| 2009/0248725 A1 | 10/2009 | Bhattacharjee et al. ...... 707/101 |
| 2009/0288064 A1 | 11/2009 | Yen .......................... G06N 5/02 |
| 2009/0307430 A1 | 12/2009 | Bruening et al. ............. 711/119 |
| 2010/0231224 A1 | 9/2010 | Lindqvist ...................... 324/365 |
| 2011/0072419 A1 | 3/2011 | Archambault ............ G06F 8/43 |
| 2012/0079464 A1 | 3/2012 | De Smet ........... G06F 17/30427 |
| 2012/0317647 A1 | 12/2012 | Brumley et al. |
| 2013/0054649 A1 | 2/2013 | Potapov ........................ 707/792 |
| 2013/0253936 A1* | 9/2013 | Harvey .................. G04G 13/00 |
| | | 704/270.1 |
| 2013/0298130 A1 | 11/2013 | Pienaar ......................... 718/102 |
| 2014/0115001 A1 | 4/2014 | Arroyo ......................... 707/772 |
| 2014/0157260 A1 | 6/2014 | Balani ................ G06F 9/45533 |
| 2014/0189667 A1 | 7/2014 | Kanhere ....................... 717/160 |
| 2014/0365533 A1* | 12/2014 | Debray .................. G06F 16/21 |
| | | 707/803 |
| 2015/0134637 A1 | 5/2015 | Pall ............................... 707/718 |
| 2015/0363294 A1 | 12/2015 | Carback, III ....... G06F 11/3672 |
| 2016/0092365 A1* | 3/2016 | Shivarudraiah ....... G06F 16/172 |
| | | 711/118 |
| 2016/0170727 A1* | 6/2016 | Mars ..................... G06F 9/4552 |
| | | 717/148 |
| 2016/0283229 A1* | 9/2016 | Rogers .................... G06F 8/751 |
| 2019/0354689 A1* | 11/2019 | Li .......................... G06F 17/16 |

FOREIGN PATENT DOCUMENTS

| | | | |
|---|---|---|---|
| JP | H10320211 | 12/1998 | .............. G06F 9/45 |
| JP | 2000187596 | 7/2000 | .............. G06F 9/45 |
| JP | 2000-315160 | 11/2000 | .............. G06F 9/45 |
| JP | 2004145589 | 5/2004 | .............. G06F 9/45 |
| JP | 2011-161502 | 8/2011 | ............ B23K 11/14 |
| JP | 2003-202994 | 7/2018 | |
| WO | WO2013096894 | 6/2013 | ............. G06F 17/30 |
| WO | WO2016161130 | 10/2016 | .............. G06F 9/45 |

OTHER PUBLICATIONS

ASR: Adaptive Selective Replication for CMP Caches, author: Bradford Beckmann et al, published on 2006.*
Title: Adaptive mechanisms and policies for managing cache hierarchies in chip multiprocessors, author: E Speight, published on 2005.*
Title: Autonomic tool for optimal cache-sharing using evolutionary techniques, author: A El Youssef, published on 2013.*
European Search Report issued in application No. 16876594.9, dated Oct. 7, 2019 (18 pgs).
Graefe et al., "The Volcano optimizer generator: extensibility and efficient search" Proceedings of the International Conference on Data Engineering, Vienna, Apr. 19-23, 1993 (10 pgs).
Japanese Decision to Grant (w/translation) issued in application No. 2017-206276, dated Feb. 6, 2019 (6 pgs).
Japanese Office Action (w/translation) issued in application No. 2017-206276, dated Dec. 13, 2018 (4 pgs).
Japanese Office Action (w/translation) issued in application No. 2018-502613, dated Dec. 4, 2018 (13 pgs).
Office Action issued in U.S. Appl. No. 14/968,827, dated Dec. 20, 2018 (40 pgs).
European Office Action issued in application 12 858 918.1, dated May 21, 2019 (4 pgs).
Office Action issued in U.S. Appl. No. 14/968,296, dated Apr. 5, 2018 (20 pgs).
Office Action issued in U.S. Appl. No. 14/968,827, dated May 17, 2018 (52 pgs).
Official Action issued in corresponding U.S. Appl. No. 14/968,827 dated Jan. 10, 2018, 47 pgs.
International Search Report and Written Opinion issued in application No. PCT/US18/39121, dated Sep. 14, 2018 (8 pgs).
Japanese Office Action (w/translation) issued in application No. 2017-206276 (6 pgs).

(56) References Cited

OTHER PUBLICATIONS

Office Action issued in U.S. Appl. No. 14/968,296, dated Oct. 26, 2018 (35 pgs).
Wei et al., "Practical Blended Taint Analysis for JavaScript," Copyright 2013 ACM (11 pgs).
European Office Action issued in application No. 12 858 918.1, dated Jul. 31, 2018 (6 pgs).
European Search Report issued in application No. 16774209.7, dated Jul. 26, 2018 (12 pgs).
Guravannavar, R., "Rewriting Procedures for Batched Bindings," Proceedings of the VLDB Endowment, Aug. 2008, pp. 1107-1123 (17 pgs).
Japanese Decision of Refusal (w/translation) issued in application No. 2018-502613, dated Apr. 3, 2019 (6 pgs).
Notice of Allowance issued in U.S. Appl. No. 14/968,296, dated Mar. 13, 2019 (26 pgs).
European Office Action issued in application 16876594.9-1224, dated Jun. 27, 2019 (22 pgs).
Graefe et al., "The Volcano optimizer generator: extensibility and efficient search," Proceedings of the International Conference on Data Engineering. Vienna, Apr. 19-23, 1993, abstract only (1 pg).
Grant et al., "DyC: an expressive annotation-directed dynamic compiler for C," Theoretical Computer Science, Amsetrdam, NL, vol. 248, No. 1/02, Oct. 6, 2000, pp. 147-199 (53 pgs).
Office Action issued in U.S. Appl. No. 14/968,827, dated Jun. 17, 2019 (46 pgs).
Lussier, D., BenchmarkSQL project description and information, downloaded from http://pgfoundry.org/projects/benchmarksql/ on Feb. 11, 2015 (2 pgs).
European Official Action issued in application No. 16876594.9, dated Oct. 24, 2019 (19 pgs).
Indian Official Action issued in application No. 5723/DELNP/2014, dated Jan. 14, 2020 (8 pgs).
International Preliminary Report on Patentability issued in application No. PCT/US2018/039121, dated Jan. 2, 2020 (6 pgs).
U.S. Appl. No. 14/368,265, filed Jun. 23, 2014.
U.S. Appl. No. 14/968,296, filed Dec. 14, 2015.
U.S. Appl. No. 14/968,827, filed Dec. 14, 2015.
Bonwick et al., "The Slab Allocator: An Object-Caching Kernel Memory Allocator," Proceedings Usenix Technical Conference, pp. 87-98, Jun. 1994 (18 pgs).
Calder et al., "Value Profiling and Optimization," Journal of Instruction-Level Parallelism, vol. 1, Mar. 1999 (37 pgs).
Canadian Official Action issued in related Canadian Patent Application Serial No. 2,860,223, dated Jan. 25, 2017 (4 pgs).
Consel et al., "A General Approach for Run-Time Specialization and its Application to C," Institut de Recherche en Informatique et Systémes Aléatoires, Jul. 1995 (24 pgs).
Consel et al., "A tour of Tempo: a program specializer for the C language," Science of Computer Programming, vol. 52, No. 1-3, Aug. 2004 (30 pgs).
Eckstein, R., "Java SE Application Design With MVC," Oracle Technology Network, Mar. 2007 (8 pgs).
Elmasri et al., "Fundamentals of Database Systems," Addison Wesley Publishing Company, 6th Edition, Apr. 2010, book summary only (2 pgs).
Free Software Foundation, Inc., "Optimize Options—Using the GNU Compiler Collection (GCC), Options That Control Optimization," downloaded from https://gcc/gnu.org/onlinedocs/gcc/Optimize-Options.html on Feb. 11, 2015 (52 pgs).
International Preliminary Report on Patentability issued in application No. PCT/US2016/025295, dated Oct. 12, 2017 (9 pgs).
International Preliminary Report on Patentability issued in application PCT/US2016/066665, dated Jun. 19, 2018 (10 pgs).
International Preliminary Report on Patentability issued in corresponding application No. PCT/US2012/071468, dated Jun. 24, 2014 (6 pgs).
International Search Report and Written Opinion issued in application No. PCT/US2016/025295, dated Jul. 29, 2016 (11 pgs).
International Search Report and Written Opinion issued in application No. PCT/US2016/066665, dated Apr. 27, 2017 (14 pgs).
International Search Report issued in corresponding application No. PCT/US2012/071468, dated Apr. 19, 2013 (3 pgs).
Japanese Decision to Grant (w/machine translation) issued in application No. 2014-548980, dated Sep. 26, 2017 (5 pgs).
Japanese Office Action (w/machine translation) issued in application No. 2014-548980, dated Aug. 3, 2017 (6 pgs).
Krikellas et al., "Generating code for holistic query evaluation," Proceedings of the IEEE International Conference on Data Engineering (ICDE), 2010, pp. 613-614 (13 pgs).
Linux Foundation, "Executable and Linking Format (ELF) Specification," TIS Committee, May 1995 (106 pgs).
Linux Foundation, "System V Application Binary Interface," Edition 4,1, Mar. 1997 (271 pgs).
Lussier, D., BenchmarkSQL project description and information, downloaded from http://pgfoundry.org/projects/benchmarksq1/ on Feb. 11, 2015 (2 pgs).
Muth et al., "Code Specialization based on Value Profiles," Proceedings International Static Analysis Symposium (SAS), Jun. 2000 pp. 340-350 (20 pgs).
Notice of Allowance issued in U.S. Appl. No. 14/368,265, dated Dec. 20, 2016 (22 pgs).
Notification for Reasons for Refusal issued in corresponding Japanese Appln. Serial No. 2014-548980, dated Sep. 30, 2016, with English translation (26 pgs).
Office Action issued in U.S. Appl. No. 14/368,265, dated May 31, 2016 (25 pgs).
Office Action issued in U.S. Appl. No. 14/968,827, dated Jun. 30, 2017 (49 pgs).
PCT Notice—Invitation to Pay Additional Fees issued in related PCT International Patent Application Serial No. PCT/US2016/066665, dated Jan. 30, 2017 (2 pgs).
PostgreSQL Global Development Group, "18.4 Resource Consumption," PostgreSQL 8.4.22 Documentation, downloaded from http://www.postgresql.org/docs/8.4/static/index.html on Feb. 11, 2015 (9 pgs).
Supplemental European Search Report issued in application No. 12858918.1, dated Oct. 27, 2015 (9 pgs).
Transaction Processing Performance Council, "TPC Benchmark™-C," Revision 5.11, Feb. 2010 (132 pgs).
Transaction Processing Performance Council, "TPC Benchmark™-H," Revision 2.1.0 (150 pgs).
Valgrind Developers, "Callgrind: a call-graph generating cache and branch prediction profiler," Valgrind User Manual, Release 3.10.0, Sep. 10, 2014 (19 pgs).

* cited by examiner

BROADENING FIELD SPECIALIZATION

CROSS REFERENCE TO RELATED APPLICATION

This is a 35 U.S.C. § 371 application based on PCT/US2016/066665, filed Dec. 14, 2016, which is a continuation-in-part of U.S. application Ser. No. 14/968,296, filed Dec. 14, 2015, now U.S. Pat. No. 10,365,900, issued Jul. 30, 2019, which is hereby incorporated by reference in its entirety.

STATEMENT REGARDING FEDERALLY SPONSORED RESEARCH OR DEVELOPMENT

This invention was made with Government support under Grant Nos. IIS0803229, CNS0938948, and 1318343 awarded by NSF. The Government has certain rights in the invention.

BACKGROUND OF THE INVENTION

Field of the Invention

The present disclosure is generally related to field specialization broadening to multiple application domains, and more particularly is related to systems and methods for broadening field specialization to extend particular values of the invariants beyond the source code of the application to the data sources themselves.

Description of Related Art

A database management system (DBMS) is a collection of software programs that manage the storage and access of data. As larger volumes of data are being generated nowadays and thus must be stored and efficiently accessed, DBMSes have been adopted across a wide range of application domains. Driven by such ubiquitous deployments over the last four decades, DBMSes have been designed and engineered based on a few data models that are generally applicable to those domains. The relational data model is the one most prevalently adopted by commercial and open-source DBMSes. A significant amount of effort has been devoted to efficiently support this data model.

Due to the generality of the relational data model, relational database management systems are themselves general, in that they can handle whatever schema the user specifies and whatever query or modification is presented to them. Relational operators work on essentially any relation and must contend with predicates specified on any attribute of the underlying relations. Through such innovations as effective indexing structures, innovative concurrency control mechanisms, and sophisticated query optimization strategies, the relational DBMSes available today are very efficient. Such generality and efficiency has enabled their proliferation and use in many domains.

Nevertheless, such generality is realized via multiple layers of indirections and sophisticated code logic. Efficiency can be further enhanced for DBMSes by exploiting invariant values present during the execution of such systems. Field specialization technology has been developed to automatically identify invariants and effect code specialization based upon invariants. Field specialization is the process of inserting spiffs into DBMS code so that the DBMS can specialize itself at runtime to exploit runtime invariants. A spiff, which stands for specializer in the field, is code that dynamically creates specialized code at DBMS runtime. The specialized code is both smaller and faster than the original unspecialized code. Field specialization gets its name from the fact that the code is specialized "in the field," i.e., after the DBMS has been deployed and is running at the end user's site. A spiff uses the actual value of a runtime invariant which can only be known at runtime—to dynamically produce code that is specialized to that particular value of the runtime invariant.

It would be desirable to have the field specialization broadened to multiple application domains to elaborate a paradigm of computer science.

BRIEF SUMMARY OF THE INVENTION

Embodiments of the invention relate to field specialization broadening to multiple application domains, and more particularly is related to systems and methods for broadening field specialization to extend particular values of the invariants beyond the source code of the application to the data sources themselves.

In accordance with one embodiment of the present invention, an ecosystem specification is disclosed to enable field specialization broadening. This specification states which (potentially multiple) applications are involved, what (potentially multiple) input data sources are read by one or more applications, what intermediate and final data products are produced by those applications, and what services are invoked by the applications, thereby providing valuable information on how intermediate results are communicated among the various applications.

Capturing in the ecosystem specification the input, intermediate, and final data sources along with the multiple applications participated in the computing allows field specialization to be broadened. The flow of particular values of the invariants may be extended beyond the source code of the application to the data sources themselves, across file read and write operations and even via network communication, such as passing the resulting data to the operating system (e.g., Linux), which then passes this data into the networking component, which then passes the data to other destinations.

In some embodiments, a static and/or a dynamic analysis determines that an invariant within a specialization opportunity arose even earlier than an assignment to a C variable within the application; rather, it arose from a data component at a particular location within an input data file, such as oil field data or a config parameter utilized by an oil-field simulation software. Once such a value flow is determined, spiffs are created in the appropriate applications and, when given a particular oil field data file, the spiffs are executed to produce a speccode of a specialization opportunity within the oil field simulator application. This speccode could be associated with the particular oil field data file, to be loaded dynamically into the oil field simulator application (or passed to the operating system or stored in the IBM cluster) when that application is run. In this way, all of the applications involved in a computation can participate and be optimized, via a broadened conception of field specialization.

In some embodiments, the method of field specialization broadening comprises a sequence of steps: (i) deciding what (extended) invariants are there, (ii) deciding which of these extended invariants should be specialized upon, (iii) deciding what code sequence within a specialization opportunity should actually be specialized, (iv) deciding when to perform the specialization (and thus, within which application), (v) deciding where to store the generated speccode, and finally, (vi) deciding how to transfer the speccode to the site (application) where it will be invoked.

In some embodiments, the method of field specialization broadening comprises extending step (i) to include invariants that flow from external data or external applications, step (iv) to include spiffs located in an application separate from the application containing the source of the invariant that is being utilized by the spiff, or even autonomous from any application, and steps (v) and (vi) to include speccode stored separately from the application being specialized.

In some embodiments, a method is disclosed to estimate cache pressure given a specific workload and to solve the problem of instruction cache misses in the presence of code added at run-time, such as in the context of micro-specialization, when a specialized version of an often-executed portion of the DBMS can speed query evaluation. Several novel run-time code placement algorithms are implemented. The algorithms include a MaxResidency algorithm, which uses information from dynamic analysis of provided workloads prior to DBMS compilation as well as the specific structure of the query evaluation plan to place run-time code wisely, thus retaining most of the possible run time improvement of that code. It is demonstrated that the algorithm minimizes I-cache pressure for workloads that utilize as many as 1000 dynamically-linked functions. Via this algorithm, aggressive micro-specialization of a large number of functions invoked during query evaluation can effectively mitigate an increase in I-cache pressure and thus also L2-cache pressure.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

DETAILED DESCRIPTION OF THE INVENTION

Figure 1:
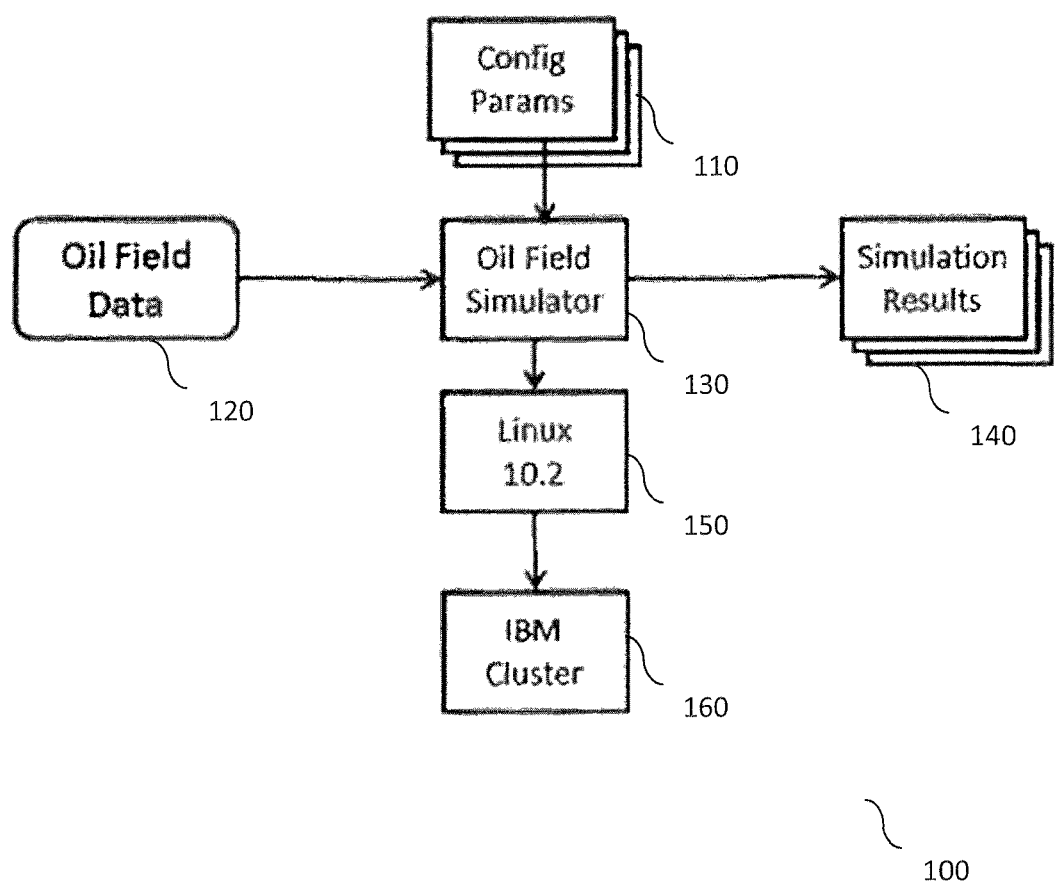
FIG. 1 is a block illustration of a single application field specialization process.

Various implementations and embodiments may be practiced in line with the specification. All of these implementations and embodiments are intended to be included within the scope of the invention.

Many embodiments of the disclosure may take the form of computer-executable instructions, including algorithms executed by a programmable computer. However, the disclosure can be practiced with other computer system configurations as well. Certain aspects of the disclosure can be embodied in a special-purpose computer or data processor that is specifically programmed, configured or constructed to perform one or more of the computer-executable algorithms described below.

The disclosure also can be practiced in distributed computing environments, where tasks or modules are performed by remote processing devices that are linked through a communications network. Moreover, the disclosure can be practiced in Internet-based or cloud computing environments, where shared resources, software and information may be provided to computers and other devices on demand. In a distributed computing environment, program modules or subroutines may be located in both local and remote memory storage devices. Aspects of the disclosure described below may be stored or distributed on computer-readable media, including magnetic and optically readable and removable computer disks, fixed magnetic disks, floppy disk drive, optical disk drive, magneto-optical disk drive, magnetic tape, hard-disk drive (HDD), solid state drive (SSD), compact flash or non-volatile memory, as well as distributed electronically over networks including the cloud. Data structures and transmissions of data particular to aspects of the disclosure are also encompassed within the scope of the disclosure.

Moreover, while field specialization is disclosed herein primarily with respect to a DBMS, it should be understood that the concepts provided herein may be applied to any program that manipulates data and in particular, performs complex analysis on that data.

A "spiff," which stands for specializer in the field, is code that dynamically creates specialized code at DBMS runtime. "Field specialization" is the process of inserting spiffs into DBMS code so that the DBMS can specialize itself by exploiting runtime invariants. The specialized code (which may be referred to herein as "speccode") is both smaller and faster than the original unspecialized code. Field specialization gets its name from the fact that the speccode is generated and invoked "in the field," i.e., after the DBMS has been deployed and is running at the end user's site. A spiff uses the actual value of a runtime invariant which is obtained at runtime—to dynamically produce code that is specialized to that particular value of the runtime invariant.

In Applicants' co-pending U.S. patent application Ser. No. 14/368,265, which the present application claims priority to, the term "micro-specialization" is equivalent to the term "field specialization" as used herein; the term "bee" is equivalent to the term "spiff" as used herein; an instantiated bee is equivalent to "specialized code" as used herein, which is the result of a spiff; and the HRE (hive runtime environment) is equivalent to "SRE" (spiff runtime environment) as used herein.

FIG. 1 is a block illustration of a single application field specialization process. The exemplary single application field specialization process 100 is related to an oil field over time. The single-application field specialization process has been disclosed and included in patent application with application No. 62/142,325 (Dataware 15.01-P). Both the initial field specialization and the broader one discussed here apply to any application domain that processes the same data multiple times.

Referring to FIG. 1, a simulator 130 receives inputs from a field dependent source data 120 and a user-defined parameter 110. As shown in FIG. 1, the field dependent source data 120 ("oil field data") specifies a structure of an oil field, a three-dimensional assemblage of rock structures, some of which hold various mixtures of oil, gas, water at various pressures and some of which are impermeable. The user-defined parameter 110 (also referred as "config params" or workload) specifies wells to be drilled at various times and fluids to be extracted at various rates over time. The simulator 130 then computes how the fluids flow throughout the oil field over time, over simulated time of perhaps many years, producing a "simulation result". The simulations may be implemented many times, each time with a different user-defined parameter 110 and with a single simulation result 140 as an output. In some embodiments, the simulator may pass the simulation result 140 to a Linux operation system 150, which then passes the data to a computer cluster (such as an IBM cluster) 160.

Although FIG. 1 is shown with the exemplary oil field related application, it is understood that the single application field specialization process may be applicable to various fields.

In some embodiments, the oil field simulator may be written in a high-level language such as C. A Spiff toolset (shown in FIG. 2) that analyzes the simulator can follow the flow of values through this C program, flowing from cold code into hot code as a data value is copied from one C variable, perhaps within a complex data structure, to another. The Toolset can then identify specialization opportunities: segments of hot code, that is, a program component that's frequently executed, containing variables that are invariant at runtime. The values of these variables are known to have originated in cold code (i.e., written once) and are used (i.e., read many) in branching or other statements in hot code, such that by knowing the particular value of an invariant, the identified hot code segment may be specialized to run faster, say by removing a branch statement along with the dead branch(es) from hot code. The specialization opportunities enable the creation of spiffs, which are placed in the cold code and can produce specialized code (abbreviated as speccode).

The aforementioned field specialization focuses on the source code of the application, such as the oil field simulator shown in FIG. 1, performing static and dynamic analysis to identify invariants (C variables) and specialization opportunities (segments of code) that can then be specialized given a particular value for each relevant invariant.

Figure 2:
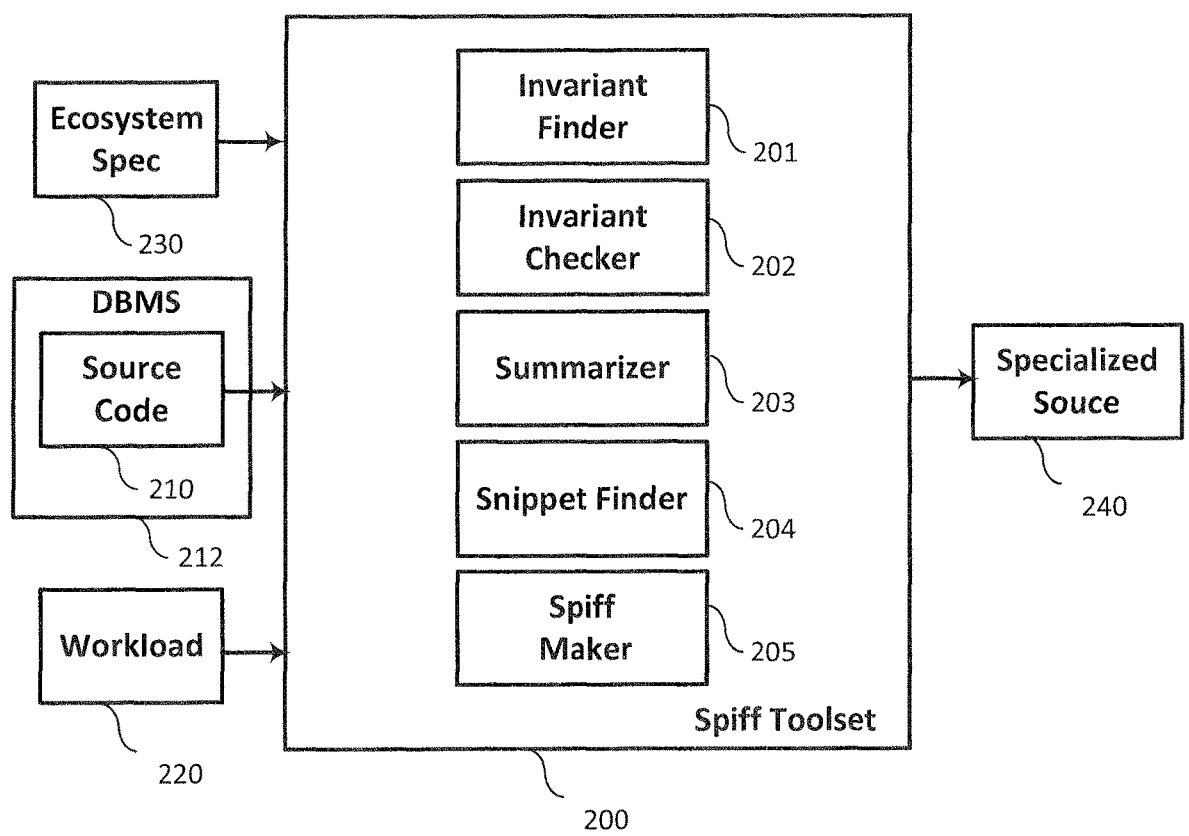
FIG. 2 is a block diagram illustrating the spiff toolset, in accordance with an exemplary embodiment provided by this disclosure.

FIG. 2 is a block diagram illustrating a spiff toolset, in accordance with an exemplary embodiment provided by this disclosure. The spiff tool toolset 200 receives inputs as an Application's source code (or application code) 210, one or more workload 220, and an Ecosystem Specification 230 (referred to herein as "Ecosystem Spec") and outputs a Specialized Source Code 240. In some embodiments, a graphical user interface (GUI) is placed at a higher level than the Spiff Tools to be used by the application developer to request that the tools be executed in sequence and to visualize how the field specialization was achieved, by showing in an appropriate manner the intermediate and generated results. This GUI also provides actions that the developer can perform that will impact the operation of other tools. In some embodiments, the spiff tool toolset 200 is constructed as a field specialization broadening module. In one embodiment, the source code 210 is a DBMS source code comprised within a DBMS 212 of one application.

The spiff tool toolset 200 provides an end-to-end solution that takes source files for a program or suite of related programs and automatically provides field-specialized versions of those source files, including the code for spiff generation, spiff compilation, spiff instantiation, spiff invocation, and spiff garbage collection. In some embodiments, the spiff toolset 200 includes a number of tools, including but not limited to an invariant finder 201, an invariant checker 202, a summarizer 203, a snipper finder 204, and a spiff maker 205. The invariant finder 201 may couple to both the Application's source code 210 and one or more workloads 220 and perform static analysis on the AST and output zero or more Invariant Intervals. The invariant checker 202 ensures the validity of output Invariant Intervals from the invariant finder 201. The summarizer 203 produces execution summaries, which provide output as a list of functions, statements, and variables along with their execution statistics. Such information indicates "hot spots" within the application that could benefit from field specialization. The Snippet Finder 204 first expands invariants to across program executions by tracking which variables are read from files and where those values are put into files. This results in invariant intervals that span multiple executions. The tool also tracks when the value was first written to the file and when it is deleted. The Spiff maker 205 takes one or more Candidate Snippets as input and output the Specialized Source Code 240.

In some embodiments, the aforementioned tools within the spiff toolset 200 are placed within a single computer apparatus. In some embodiments, the aforementioned tools within the spiff toolset 200 are placed among distributed computers.

The Ecosystem Specification 230 provides additional information that enables the analysis performed by the simulator 130 to be broadened considerably. The specification 230 states which (potentially multiple) applications are involved, what (potentially multiple) input data sources are read by one or more applications, what intermediate and final data products are produced by those applications, and what services are invoked by the applications, thereby providing valuable information on how intermediate results are communicated among the various applications. Thus the Ecosystem Specification 230 may capture a bigger picture beyond the single oil field simulator 130, which only takes a single "oil field data" source and one "config params" data source as inputs to produce a single "simulation result" data product.

Capturing in the Ecosystem Specification 230, the input, intermediate, and final data sources along with the multiple applications that participate in the computing process allows field specialization to be broadened such that the flow of particular values of the invariants may be extended beyond the source code of a single application. Furthermore, field specialization broadening also enables across file RW (read/write) operations and even operations via network communication, such as passing the resulting data to an operating system such as Linux and to other destinations. In some embodiments, static and dynamic analysis may determine that an invariant within a specialization opportunity arose even earlier than an assignment to a C variable within the single application. Instead, the invariant is extracted from a data component at a particular location within an input, such as the oil field data or the config parameters. Once such a value flow is determined, spiffs may be created in the appropriate applications. When an oil field data file is given, the spiffs is executed to produce speccode of a specialization opportunity within the oil field simulator application. This speccode could be associated with the particular oil field data file, to be loaded dynamically into the oil field simulator application (or passed to the Linux OS 150 or stored in the IBM cluster 160) when that application is run. In this way, all of the applications involved in a computation can participate and be optimized, via a broadened conception of field specialization.

At least three exemplary extensions may be implemented for field specialization broadening.

The first extension to field specialization is cross-application value flows (where a value transfers out of one application and subsequently into another application), specified by the ecosystem spec for how data travels from one application to another. Within a single application, as viewed by field specialization, a value flows from one C variable to another via a data copy, implemented with low-level load and store operations. With the availability of an ecosystem spec, additional kinds of transfers can be accommodated in the invariant flow analysis. For instance, one such transfer is passing a value as a parameter (which can be a structure) to an operating system call and receiving a return value from a system call can establish data flow between an application and the OS. In addition, the ecosystem spec can support specification of other means of communication, such as exchanging data across devices. For example, a graphics processing unit (GPU) may communicate with a central processing unit (CPU) over a memory bus, with values copied via network communication channels, such as sockets. The ecosystem spec annotates a plurality of connecting paths with the means for such value transfers and the Spiff Toolset analysis utilizes such transfers to extend the value flows, thereby identifying additional cross-application value flows and additional specialization opportunities within each of the participating applications.

The second extension to field specialization is an inter-application analysis. The static and dynamic analysis is performed by the Spiff Toolset not just on the source code of a single application, but also across the data read and written by that application. That analysis may be similarly extended to other applications or operating systems invoked by an application, such as the Linux operating system, or storing invariant values, such as within an IBM cluster, shown in FIG. 1. A particular value within the oil field data flows into the oil field simulator application, then flows into the Linux operating system as a system call parameter or as data passed through a system call, then flows into the IBM cluster. This same value may flow back into the simulator from the Linux O/S as an operating system return value or data value returned. A complex data flow may travel back and forth between the three applications illustrated here, across different system calls and within different C functions in each of these applications. Inter-application analysis combines the per-application value flow analysis, performed by the Spiff Toolset, with analysis of data read by application or sent from one application to another. Inter-application analysis need to understand the semantics of the cross-application value flows and be able to combine value flows within a single application to compute value flows across applications. Furthermore, inter-application analysis is able to determine where the speccode that is associated with particular invariants can be best instantiated.

The third extension to field specialization is invariant cross-application termination, verifying the possibility of an invariant originating in an application (or data source or product) and terminating in a specialization opportunity in a separate application. This enables flexibility in placing the spiff, in associating speccode with a data source or product or application, and in shipping the speccode to the destination application. The Spiff Toolset can determine where the speccode can be best stored and subsequently communicated to the relevant application where it will be installed. The Spiff Runtime Environment needs mechanisms to handle the variations enabled by the structure provided by an ecosystem spec.

Figure 3:
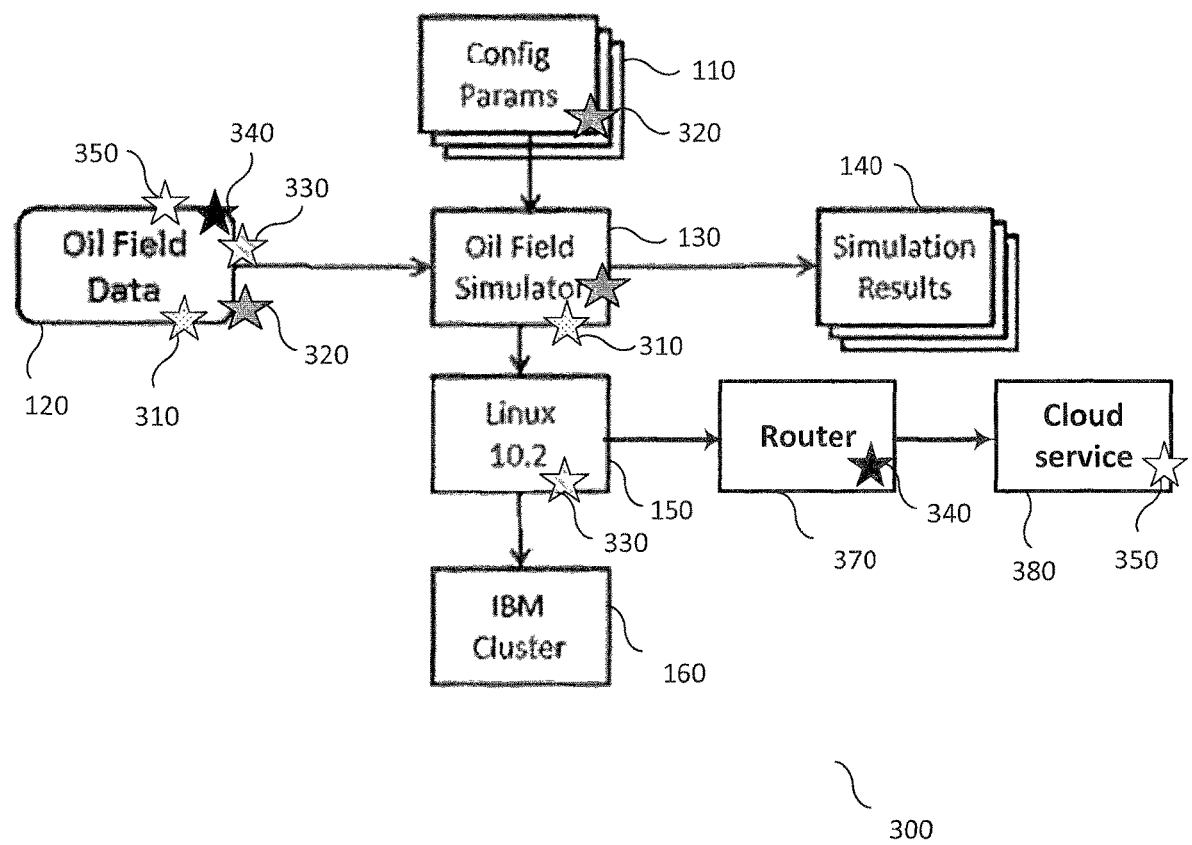
FIG. 3 is a block illustration of a field specialization broadening process involving three extensions in accordance with an embodiment of the present invention.

FIG. 3 is a block illustration of a field specialization broadening process involving the three extensions just described, in accordance with an embodiment of the present invention. Comparing to the field specialization process 100 for single application shown in FIG. 1, the field specialization broadening process 300 comprises additionally a router 370 (a hardware device that now comes with significant computation capacity) and a cloud service 380 (including data analytics). The router 370 receives inputs from the Linux operation system 150 and passes the inputs to the cloud service 380.

The stars in FIG. 3 represent speccode created by spiffs (not shown) that were added through the broadened field specialization process. The spiffs are added to utilize the value flows described above. The field specialization process determines where the Speccode should be stored. For example, speccode 310 may involve invariants both from the oil field data 120 and the oil field simulator 130. Speccode 320 may involve invariants both from the config params 110 and the oil field simulator 130. Speccode 330 stored in the Linux operating system 130 may involve invariants from the simulator and oil field data. Speccode 340 stored in the router 370 and Speccode 350 stored in the cloud 380 may also involve invariants from the simulator and the oil field data.

The speccode stored within the simulator may originate from the oil field data and from the simulator itself, and may be identified through basic field specialization. Other spiffs are stored with the operating system, router, and cloud, specializing code found in the indicated applications. In some embodiments, speccodes may flow from where they are stored to where they may be invoked (the application that provided the specialization candidate from which they were subsequently specialized). For example, the oil field data may store the router speccode 340. In some embodiments, speccode identifiers can reside with data or with applications and can also be included in communications with subsequent applications, indicating the relevant speccode to (later) invoke.

Below are two exemplary fields which the original oil field specialization may be broadened to cover.

Web applications: A backend web server is responsible for processing input data obtained from user activities at the front-end, i.e., in web browsers that run javascript applications. The user inputs can vary and hence present different patterns within the data collected at the backend. The backend server can then produce client (javascript) speccode for different value patterns that can then be pushed to the (appropriate) browsers.

Data center work distribution: A distributor for work packets is common in big data applications (such as Hadoop). The distributor is an application that can parcel out the work based on certain attributes, which can then serve as invariants to specialize the tasks running on different worker nodes. In this case also, the spiff and the speccode it generates is in an application separate from the invoked application.

Figure 4:
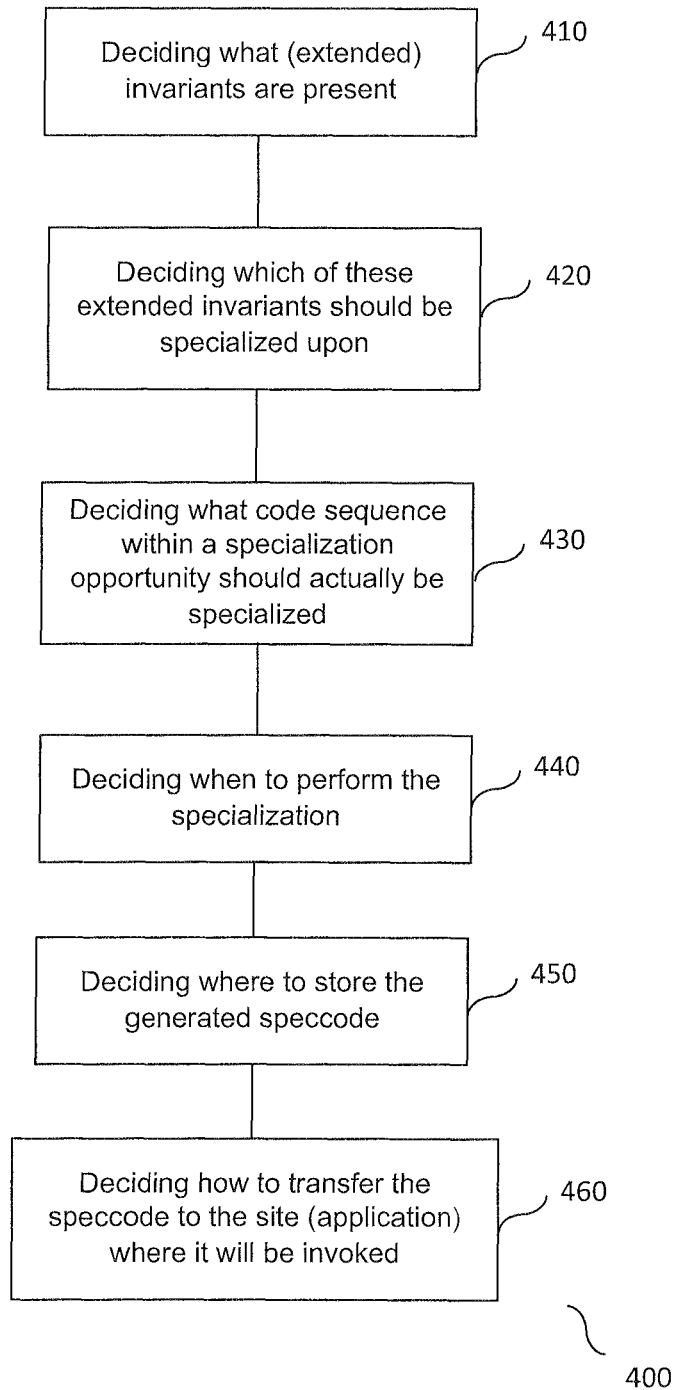
FIG. 4 is an illustration of a flow process of broadened field specialization with an embodiment of the present invention.

FIG. 4 is an illustration of a flow process of broadened field specialization with an embodiment of the present invention. In broadened field specialization, there is a sequence of decisions to be made. The flow process of broadened field specialization 400 shown in FIG. 4 comprising a plurality of steps to address the sequence of decisions. Step 410 is deciding what (extended) invariants are present; Step 420 is deciding which of these extended invariants should be specialized upon; Step 430 is deciding what code sequence within a specialization opportunity should actually be specialized; Step 440 is deciding when to perform the specialization (and thus, within which application); Step 450 is deciding where to store the generated speccode, and finally, Step 460 is deciding how to transfer the speccode to the site (application) where it will be invoked. Although the steps shown in FIG. 4 are related to broadened field specialization, it is understood that the steps are also applicable to conventional field broadening, since the steps are necessary for field specialization in general.

Figure 5:
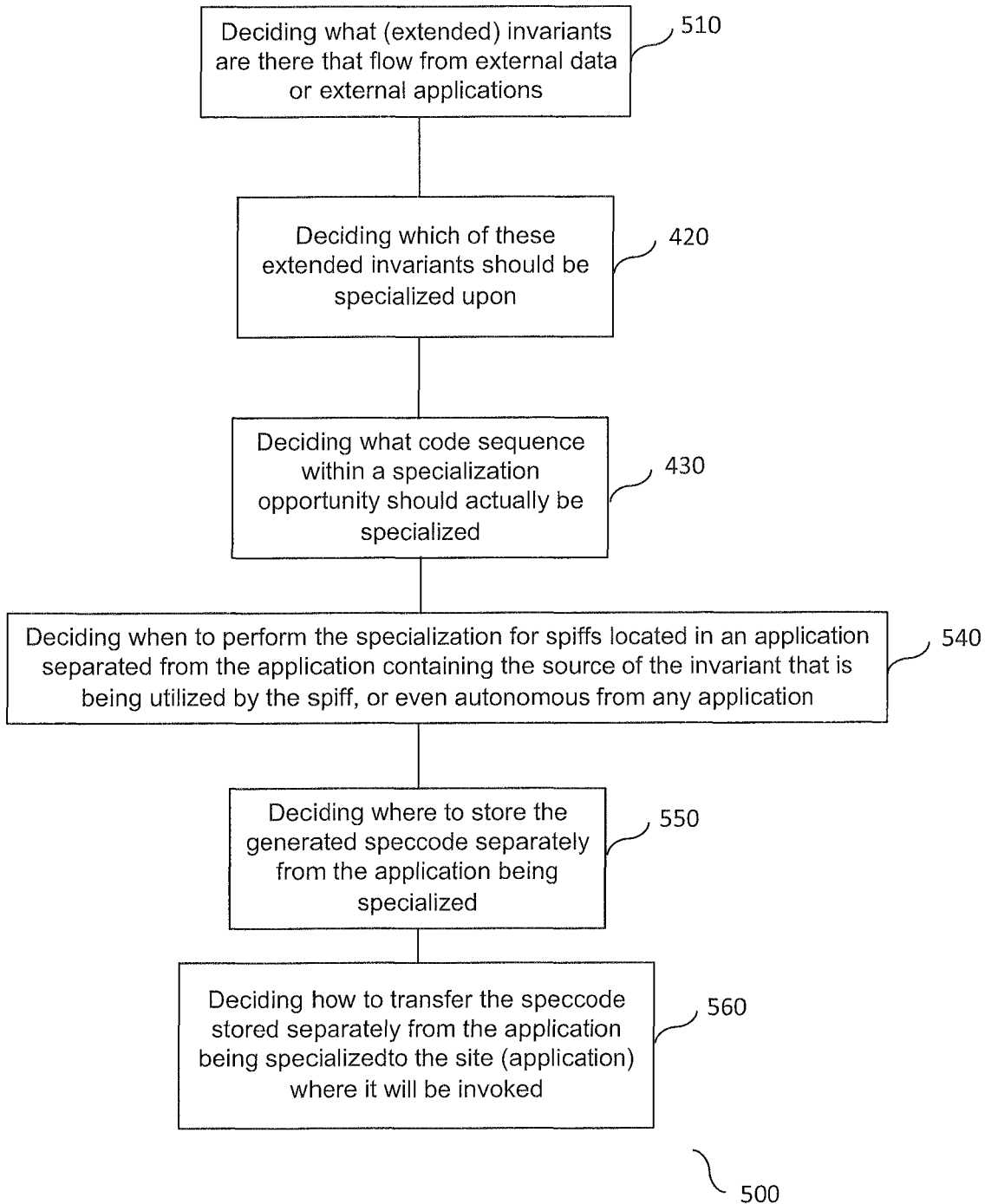
FIG. 5 is an illustration of an alternative flow process of broadened field specialization with an embodiment of the present invention.

FIG. 5 is an illustration of an alternative flow process of broadened field specialization with an embodiment of the present invention. Compared to the field specialization process shown in FIG. 4, step 510 in FIG. 5 is extended to invariants that flow from external data or external applications; step 540 in FIG. 5 is extended to spiffs located in an application separated from the application containing the source of the invariant that is being utilized by the spiff, or even autonomous from any application, and steps 550 and 560 in FIG. 5 are extended to speccode stored separately from the application being specialized.

The flow process of broadened field specialization disclosed within this disclosure may be stored as computer executable instructions within a non-transitory computer readable medium and executable by a processor of a computing device. In some embodiments, the specialization broadening process may be executed by a plurality of computers with different computers executing different process steps.

Figure 6:
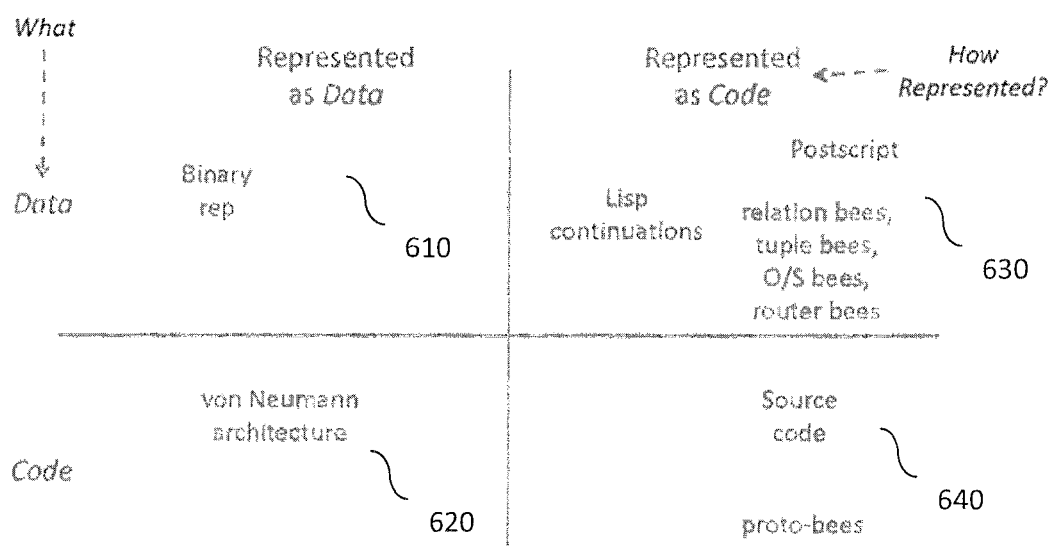
FIG. 6 is an illustration of field specialization for elaboration a paradigm of computer science with an embodiment of the present invention.

FIG. 6 is an illustration of field specialization for elaboration a paradigm of computer science with an embodiment of the present invention. The diagram comprises four quadrants 610, 620, 630 and 640 for scenarios of data represented as data, code represented as data, data represented as code, and code represented as code respectively.

In the early stages of computer architecture, from the Babbage machine through the 1930's, data was differentiated from code. The data was what was manipulated and the program code was the instructions for how to manipulate the data to effect a computation. This is represented in quadrants 610 and 640 in FIG. 6 as data represented in binary format in a computer memory or storage device, that is, data stored as data, and source code represented in some other way (e.g., patch cords), that is, code represented as code.

In the 1940's, John von Neumann proposed a revolutionary architecture that stored the program in machine code in the computer's memory as numbers, mixing code and data. (Indeed, the code can be manipulated as data, and even changed during the running of the program.) This architecture is represented in quadrant 620, with code (machine instructions) represented as data.

In the 1960's there were some initial forays into combining code, in the form of a Lisp function, with data, say the value of one of the arguments, to produce a List continuation, which is a Lisp function (code) paired with the value of that parameter, which is just a function with one less argument. This is in a very particular way that data are stored/encapsulated in code, as represented in quadrant 630.

In the 1980's the Postscript language was invented. This was code that when executed would create an image. Postscript is produced by a formatter, taking a document such as a Microsoft Word file, which is data, and converting to a program, again, code as data, as represented in quadrant 620.

Field specialization takes this idea further. Field specialization takes the values of invariants, that is, data, and uses these values to create a specialized code version of a portion of an application, such as a DBMS, which is code that can be executed. So a relation speccode is the result of specializing DBMS code using the schema of a relation (data). A tuple speccode is the result of using the data values within a tuple (row of a table). An O/S speccode is a specialization of a snippet of an operating system based on particular data values of particular invariants within that snippet; ditto for router speccodes.

This data-represented-as-code (as represented in quadrant 630) can be created in one application from a snippet in that application or another application, passed around between applications, and invoked by the target application when appropriate. The field specialization technology provides the means for identifying when such speccode are effective in increasing performance, when they should be created, with which invariants should they be specialized upon, how they can be communicated across applications, and when they should be invoked.

The implication is that for any coherent region within a data file, it is possible to ascertain the invariant values within that region, follow those values into areas of the application code, and then make speccodes out of those areas, then associate those speccodes back to their regions. This perspective thus focuses on the originating data, rather than starting with the code and specializing it, which then opens up new opportunities and technology.

Extension 4: Introducing Code into a DBMS at Run-Time While Minimizing Cache Pressure Disclosed below is a fourth extension for field specialization broadening process besides the three extensions described above. The fourth extension involves introducing code into a DBMS at running-time while minimizing cache pressure simultaneously.

Instruction cache misses have contributed in the past to the execution time for DBMSes. This problem can arise again in the presence of code added at run-time, say in the context of micro-specialization, when a specialized version of an often-executed portion of the DBMS can speed query evaluation. In cases where this run-time code causes even a small increase in the I-cache miss rate, the benefit of such optimizations may be obviated. Judiciously placing newly-generated code in main memory can result in a substantial reduction in execution time.

A related challenge is that the code placement algorithm should not itself introduce much overhead. This implies that classic code placement algorithms commonly used at compile time are generally too slow to be used at run time to place dynamically-generated code.

As long as there has been a memory hierarchy (e.g., in FIG. 7), there have been strategies for minimizing the performance hit of accessing the slower (and larger) portions of this hierarchy within a DBMS. Initially the battle was on minimizing disk I/O latency. This challenge was addressed through a combination of sophisticated disk-based data structures such as B+-trees and hash indexes and sophisticated query evaluation methods such as sort-merge join. Later attention has been moved to the data caches in modern architectures.

Figure 7:
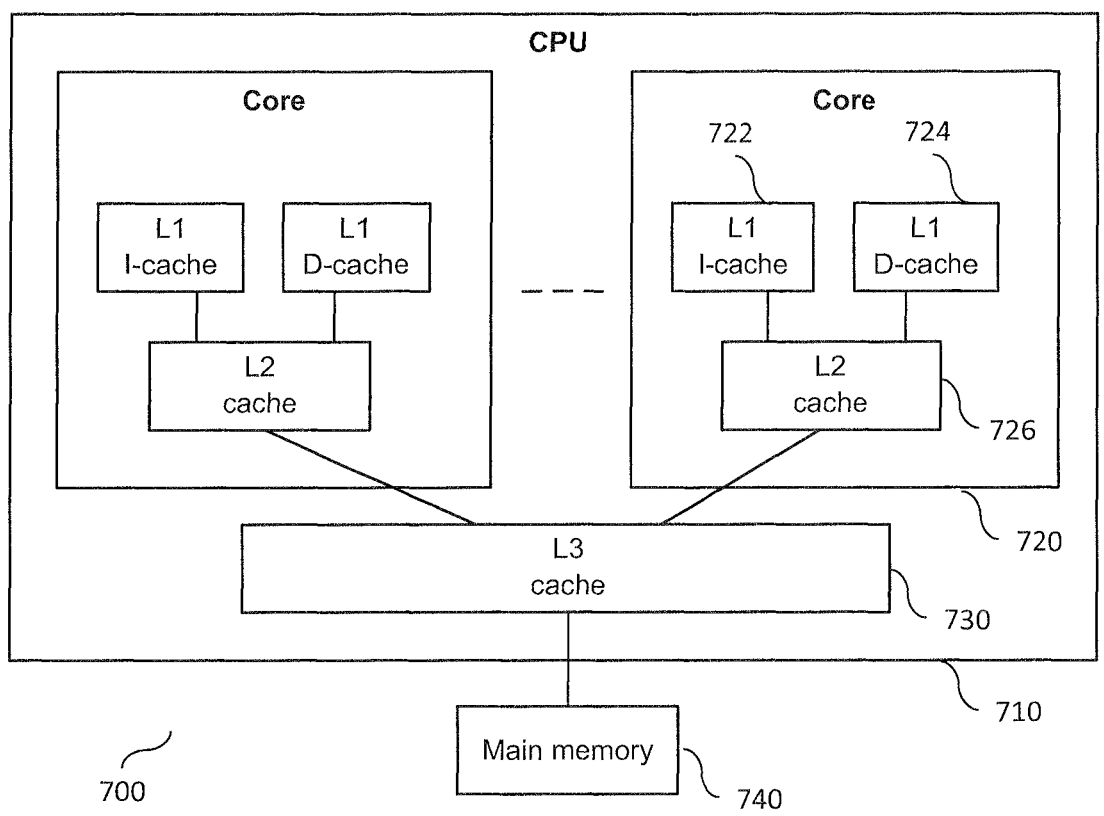
FIG. 7 is an exemplary Cache Hierarchy with an embodiment of the present invention.

FIG. 7 is an exemplary cache hierarchy with an embodiment of the present invention. As shown in FIG. 7, the cache hierarchy 700 shows a communication between a CPU 710 comprising CPU cache(s) and a main memory 740. A CPU cache is a hardware cache used by the central processing unit (CPU) of a computer to reduce the average cost (time or energy) to access data from the main memory. The cache is a smaller, faster memory which stores copies of the data from frequently used main memory locations. Most CPUs have different independent caches, including instruction cache (I-cache) and data caches (D-cache), where the data cache is usually organized as a hierarchy of more cache levels (L1, L2, etc.). As shown in FIG. 7, the CPU 710 comprises one or more cores 720 with each core having its own cache hierarchy. Each core 720 comprises a L1 I-cache 722 and a L1 D-cache 724, which are coupled to a L2 cache 726 inside the core. An L3 cache 730 couples to L2 cache 726 of each core and also couples to the main memory 740 for date/instruction exchange.

In the method of micro-specialization, small often-executed functions within query evaluation are specialized into smaller versions called bees (equivalent to "spiff" as used herein, e.g., an instantiated bee is equivalent to "specialized code" as used herein, which is the result of a spiff) that are appropriate just for that specific query, realizing a significant improvement in performance. This performance benefit, though, may come with an unfortunate increase in I-cache conflicts (termed cache pressure) and thus these approaches may actually experience performance degradation due solely to these cache misses. The reason is simple: even a small increase in number of I-cache (instruction cache) misses, say if 1% of instruction accesses do not hit the first-level instruction cache, the required subsequent accesses of the secondary cache and possibly of main memory will result in a substantial performance degradation in query run time, due to the significant I-cache penalty in modern architectures (that of 10 or more cycles for an L2 access and perhaps hundreds of cycles for a main memory access). Therefore, minimizing cache pressure is an important consideration when code is dynamically generated within a DBMS.

In this disclosure, a variety of placement algorithms are disclosed that mitigate the I-cache pressure in the presence of run-time code generation within a DBMS. These algorithms use a combination of off-line profiling and on-line code placement that takes into account the query plan, to compute a novel kind of profile called the Slot Pressure Profile, which estimates the pressure at each cache slot. The MaxResidency algorithm, which achieves the best performance among these placement algorithms, first collects the profiles of operators off-line, then examines the query plan and estimates the I-cache's pressure by taking into consideration all involved operators. Finally it determines the memory location for the generated code that will be least harmful to I-cache performance.

In this disclosure, the following features/methods will be disclosed in details to minimize cache pressure when introducing code into a DBMS at a run time:

1. Differentiating profile-guided placement algorithms from algorithms that do not use profiles. It is shown that the extra information within several kinds of profiles is helpful for placement.

2. A novel kind of profile, termed the Slot Pressure Profile (SPP), is disclosed. SPP associates a value with each cache slot, such that a slot with higher value is more likely to incur cache pressure when the address of code added at run-time maps to that slot. It is fundamentally different from a traditional Call Graph Profile, which captures only the interaction between functions, from which a statically-determined layout attempts to infer the cache pressure. Several ways to compute the SPP are also presented to better predict cache pressure.

3. A hybrid profile-guided placement algorithm is disclosed that performs the expensive profiling off-line and does on-line profile computation from the off-line profiles very efficiently.

4. A way to detect stages within the execution of a query via its query plan is disclosed. This allows better dynamic code placement by utilizing information concerning the structure of the query.

It is showed that each kind of information listed above contributes to the effectiveness of the placement. The MaxResidency algorithm combines all of these sources of information to place a large of number of bees that add little overall cache pressure, thus demonstrating that cache pressure is no longer a concern when considering aggressive micro-specialization.

To verify the effectiveness of this algorithm, an experiment is ran on a 32 KB, 128-slot, 4-way-associative I-cache and measured cache miss rate with cachegrind. With 200 dynamically-inserted bees running within PostgreSQL, the I-cache miss rate was reduced from 2.02% (when the bees were placed by a naive replacement algorithm) to 0.101% by the disclosed MaxResidency algorithm. With 400 bees, the I-cache miss rate was reduced from 3.33% to 0.144%.

In embodiments, the disclosure concerns the efficiency challenges of a confluence of three generally disparate threads: a) dealing with cache pressure, b) handling large amounts of data via a DBMS, and c) just-in-time (JIT) compilation. In the following, related previous work on these threads in isolation and in various combinations is reviewed.

Related Previous Work

When hardware caches between main memory and the CPU first appeared, additional hardware was introduced to improve their efficiency. This engendered work on better exploiting this hardware, including the next cache line and set predictor approaches, where pointers are used to find the target instruction of branches; alternative approaches of LRU; a proposal for a cache miss lookaside buffer where cache references are first stored in the LRU segment, to be promoted to a hot segment if they are referenced often; and predictive instruction fetch, where history information is used to predict the correct path of future instructions.

Software approaches usually require profiles that reflect run-time information. Notable examples include the IMPACT C profile-accepting compiler; profile guided code positioning, where functions are aggregated based on a weighted function call graph; procedure mapping, where the occupied cache lines are colored to guide the placement of remaining functions; using a temporal relation graph, where weights in the call graph predict cache misses accurately through the simulation of a full-associative cache; code reordering based on labels and call graph, where the call graph is traversed as a tree and loops are labeled to avoid conflicts; using a conflict miss graph, where edges in the graph represent worst-case number of misses; and code size reduction, where the overhead of code padding is reduced without cache miss increase. Modern compilers that employ one or a suite of these approaches are now very effective at ensuring that cache misses are a small component of the running time, with almost all instruction and data accesses being handled by the cache.

The database community initially was concerned with the upper portion of the memory hierarchy, between main memory and disk, as a database generally did not fit in main memory. But more recently, data cache optimization (between the main memory and the data cache) has been explored in detail, including data structure transformations, where data accesses are aggregated into chunks whose size is related to platform cache size in various ways; cache-conscious data structures, such as search trees that take cache size into consideration; result buffering for operators, where results from child operators get aggregated based on the type of parent operators; PAX, which adopts column storage to avoid loading unused data into the cache; and data morphing, where query workload information is used to determine the attribute layout.

Following those notable results researchers then started paying more attention to the instruction cache, including OLTP code layout optimization, where Pettis & Hansen's algorithm [K. Pettis and R. C. Hansen. Profile guided code positioning. *ACM SIGPLAN Notices*, 25(6):16-27, June 1990] is applied to database and web servers [A. Ramirez, L. A. Barroso, K. Gharachorloo, R. Cohn, J. Larriba-Pey, P. G. Lowney, and M. Valero. Code layout optimizations for transaction processing workloads. *SIGARCH Comput. Archit. News*, 29(2):155 164, May 2001]; STEPS, where common instructions are identified and kept cache-resident so that a new thread does not have to reintroduce them [S. Harizopoulos and A. Ailamaki. Improving instruction cache performance in OLTP. *ACM Trans. Database Syst.*, 31(3): 887-920, September 2006]; call graph prefetching, in which future instruction sequence is predicted by the call graph and prefetched to avoid misses in a DBMS [M. Annavaram, J. M. Patel, and E. S. Davidson. Call graph prefetching for database applications. *ACM Trans. Comput. Syst.*, 21(4): 412-444, November 2003]; and multi-core optimization, where queries are assigned to different cores based on the resources they need and the resources available at each core [R. Lee, X. Ding, F. Chen, Q. Lu, and X. Zhang MCC-DB: Minimizing cache conflicts in multi-core processors for databases. *International Journal on Very Large Data Bases*, 2(1):373-384, August 2009].

All of the work just listed makes the assumption that the program is static, which has been characterized as the "compile once and run forever" paradigm. Dynamic code generation, however, works in a "code inserted at run-time" fashion. This topic is more often discussed in the context of just-in-time (JIT) compilation, first introduced to increase the efficiency of "run-anywhere" byte-code interpreters.

One major research topic of JIT compilation is to improve the cache performance when instructions are generated and mapped to different cache slots. State-of-the-art results include: code reordering, where the virtual machine separates code and data space, rearranges methods into hot and cold portions, does code padding for frequent caller/caller pairs; cache line reservation, where some cache lines are reserved for several particular objects to avoid the eviction of these objects; partial code compilation, where dynamic analysis of control flow is utilized to avoid optimizing large functions; code tiling, where the call graph is divided into components that each fit within one cache slot in a greedy manner; JIT co-allocation, where a compiler co-allocates neighboring procedures in the call chain rather than procedures that frequently call each other; conflict matrix coloring, where a conflict matrix records the potential conflicts for a sequence of instructions and coloring is done based on the matrix; locality grouping, where the information of interaction graph and sequence of instruction is combined to group and reorder methods for co-allocation; and phase prediction, where the information of reuse distance is used to identify phases and locality in each phase.

As discussed in details in Section: COMPARISON TO PREVIOUS WORK, the above work either (a) doesn't solve the real problem, (b) is too expensive for use in DBMSes, (c) does not apply to I-cache pressure, or (d) does not contend with the complexity of query execution code.

The JIT approach has made its way into databases, in two parallel guises. One way is micro-specialization, in which frequently-executed functions containing branch instructions on identified invariants are specialized at run-time, with the newly-generated code read in (again, at run-time) to improve performance. The other way is query compilation, where the DBMS query is compiled into machine code at run-time, then that machine code is loaded and execute. The focus of the disclosure is the former, but the placement algorithms disclosed are applicable to the latter.

Micro-specialization speeds up a DBMS by specializing a general function, using information not known at compile time. For example, the number of columns in a specific table cannot be known at compile time, so a general function must be able to handle all possible numbers of columns. But the number of columns in the table is known and unchanged (except for ALTER TABLE commands) once the table is created. If this constant is hard-coded into a new function and replace the old one, at least the cost of passing that one parameter is saved, along with any branches on that value. Other invariants, such as the type and size of each column and whether each column is nullable, can also be specialized. However, this can only happen after the DBMS is compiled and the table is created, because the number of possible combinations is simply untenable.

Then when a query is executed on a particular table, that table's specialized function can be loaded into main memory. Additional specialization opportunities arise from in-variants located in individual rows, in queries, and elsewhere throughout the DBMS.

Because of the way micro-specialization works, the DBMS source code and specialized code are not aware of each other, and the benefit of a compiler taking care of code layout for the dynamically-created code may be lost.

The disclosure of this invention is to address the problem of (a) cache pressure in the context of (b) a DBMS utilizing (c) JIT techniques. The focus of the disclosure is on micro-specialization but the techniques also apply to some kinds of query compilation. In either case, it is desirable to retain the benefits of (i) main-memory/disk performance improvements utilized by conventional DBMSes, (ii) cache pressure reduction techniques commonly utilized by conventional compilers, (iii) any cache pressure reduction techniques utilized by modern DBMSes, and (iv) performance improvements realized by recent JIT approaches, specifically, micro-specialization, thereby achieving a DBMS that is highly efficient with regard to disk accesses, data cache pressure, and instruction cache pressure.

Preliminaries

During the execution of a program, each instruction executed is first fetched into the CPU cache. The slot in the cache (whether the first level instruction cache, the second level integrated cache, or even the third level integrated cache shared across CPUs) where an instruction is located, namely a cache line, is determined by the instruction's address in the virtual memory space. When multiple instructions sharing the same cache line are executed, cache conflicts may occur, resulting in expensive cache-miss penalties (cache-line eviction and instruction fetching from slower levels in the memory hierarchy.

Within DBMSes, query evaluation usually involves executing a large number of instructions over many iterations. This substantial footprint of query evaluation code can potentially lead to performance degradation due to high instruction-miss penalty. While compilers such as gcc apply basic-block reordering techniques to improve code locality thus reducing instruction cache misses, the bee code does not benefit from this optimization in that bees do not exist when the DBMS is compiled.

A 3C model [M. D. Hill and A. J. Smith. Evaluating associativity in CPU caches. *IEEE Trans. Comput.*, 38(12): 1612-1630, December 1989] provides terminology for the types of cache misses in each situation:

A compulsory miss occurs for the first access and cannot be eliminated.

A capacity miss occurs when the cache simply can't fit all the accessed memory locations; such misses can be reduced with a larger cache, in which the accessed memory locations associated with a particular cache slot get spread across several slots in the larger cache.

A conflict miss occurs when an entry that was present in the cache gets evicted by an access that would have associated the same slot even with a larger cache; such misses can be reduced by a higher cache associativity.

Several additional terms are also introduced in this disclosure.

A function F associates a cache slot S if the memory address of any piece of F's machine code maps to S.

The working set of a collection of functions to be executed is defined as the collection of the distinct memory blocks touched over the execution of a sequence of instructions. In this disclosure, the working set at the cache level is of particular interest. The cache slot working set refers to the memory blocks that are in that same working set and map to the same cache slot.

The relationship between a slot's working set size and the cache's associativity is relevant here. If the cache's associativity is less or equal to the size of that slot's working set, a slot is crowded.

A bee is a specialized version of a DBMS function that is created and loaded into memory at run-time. Such functions may occupy one memory block, multiple contiguous blocks, or multiple non-contiguous blocks.

Figure 8:
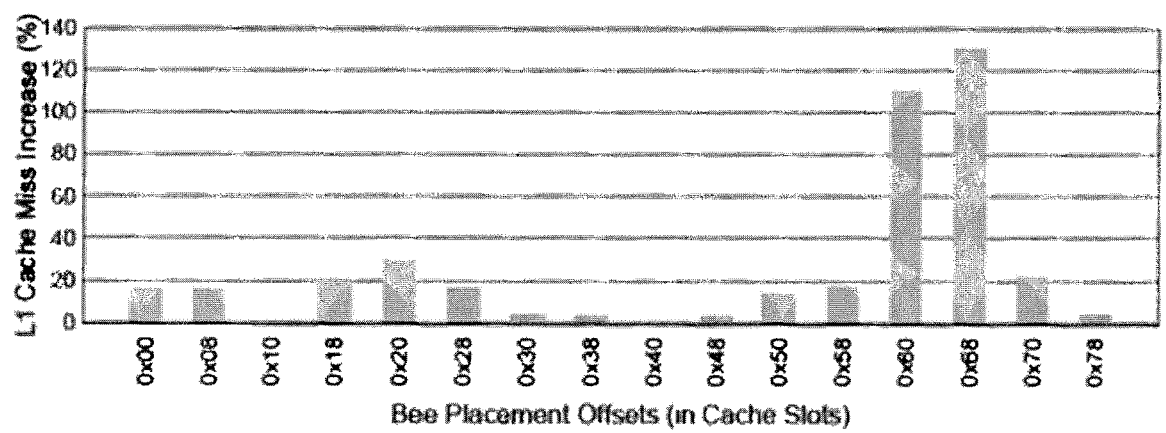
FIG. 8 is an illustration of percentage increase of L1 Misses of Query22 with Various Bee Placements with an embodiment of the present invention.

To illustrate the cache effects of executing a bee during query evaluation, FIG. 8 presents a study of the relationship between various placements of a single bee (indicated by the x axis) of a bee and the percentage increase in I-cache misses (shown by the y axis), during the evaluation of a query. As described later, the experiment machine is equipped with a 32 K I-cache, Given that each cache line is 64 bytes wide and the cache is four-way set associative, there are a total of 128 cache slots, each consisting of four cache lines. 16 placements are sampled uniformly across all 128 possible cache slots. In other words, the same query is evaluated 16 times, each time with a different placement of the bee executed during each query evaluation. As indicated by the figure, when the bee is placed at cache slots addressed at 0x10 and 0x40, respectively, the 1-cache miss rate is minimized. However, if the bee is placed at 0x68, a 130% increase in number of cache misses is observed. Overall instruction-cache (I-cache) performance is thus very sensitive to the placement of the bee. As disclosed above, the increase in cache misses results in a substantial increase in overall query evaluation time.

Figure 9:
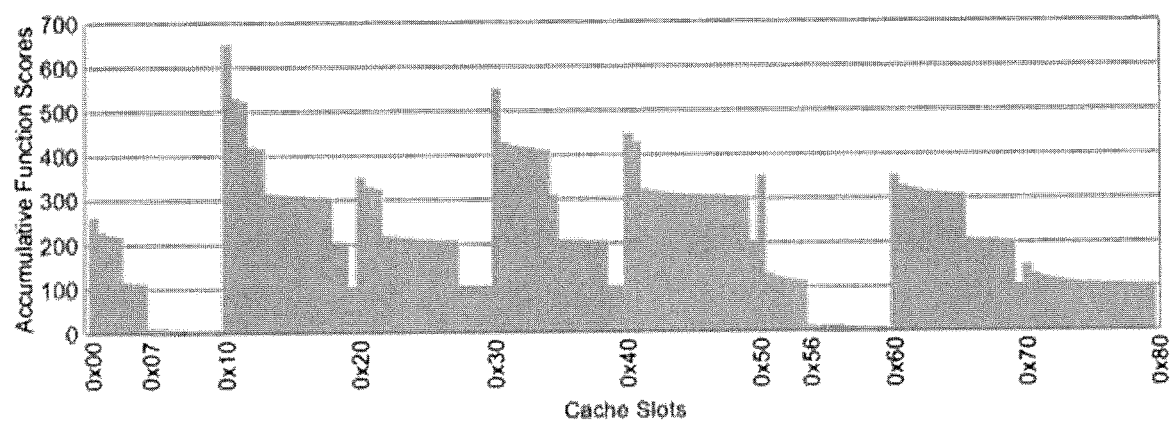
FIG. 9 is an illustration of Cumulative Cache-Line Reference histogram with an embodiment of the present invention.

FIG. 9 is an illustration of Cumulative Cache-Line Reference histogram with an embodiment of the present invention. To avoid placing a bee at slot 0x68 in FIG. 8, FIG. 9 suggests determining for a given query the cache pressure at each slot, and realizing a histogram and placing bees in the valleys where there is little pressure. In this particular case, the attractive valleys are at ox07-ox0f and ox56-ox60. A clever scheme will be introduced later.

There are three possibilities describing how the existing DBMS code interacts at the I-cache level with a bee that has just been loaded into memory, when the existing code and the bee associate the same cache slot.

1. The existing DBMS code has a small working set at this slot, so doesn't use up its cache capacity. In this case, the bee only causes compulsory misses, introducing little cache pressure.
2. The existing DBMS code has a large working set at this slot, so uses up the cache capacity and experiences both capacity and conflict misses. In this case, instructions in the bee evict existing DBMS code and cause an increase of conflict misses. Such behavior is called a DBMS-bee conflict. This case is fairly predictable, and indeed algorithms will be provided that do a good job of avoiding such conflicts.
3. The existing DBMS code has a medium working set at this slot, so uses up the cache capacity yet experiences no conflict misses. In this case, because the DBMS will revisit its existing code as well as the bee frequently during query evaluation, instructions in the bee will evict existing DBMS code from the cache and thus perhaps cause a sharp increase of conflict misses. This is the challenge to be addressed.

What if multiple bees need to be placed? If several bees associate the same slot, DBMS code that associates this slot may cause cache misses, and thus, may exhibit DBMS-bee conflict. If successive bees also associate this slot, those bees could conflict with each other, termed inter-bee conflicts. Both kinds of conflicting bee behavior can be avoided by taking into account how crowded a slot is when deciding bee placement. Thus the problem of predicting cache pressure is reduced to the problem of ascertaining the size of working set at each cache slot.

The average cache miss rate of TPC-H queries with a naive placement rises to 0.912% with 200 bees, 1.66% with 400 bees, and 2.95% with 1000 bees. This is of concern when a cache miss is more than 10 times slower than a cache hit. A more sophisticated placement algorithm is required.

Disclosed below are the placement algorithms in two categories: profile-agnostic and SPP-guided, based on the information they use.

Profile-Agnostic Algorithms

Profile-agnostic algorithms may be relatively simple in terms of design but generally offer mediocre performance. They are introduced as warm-up and further opportunities are explored for optimization.

Figure 10:
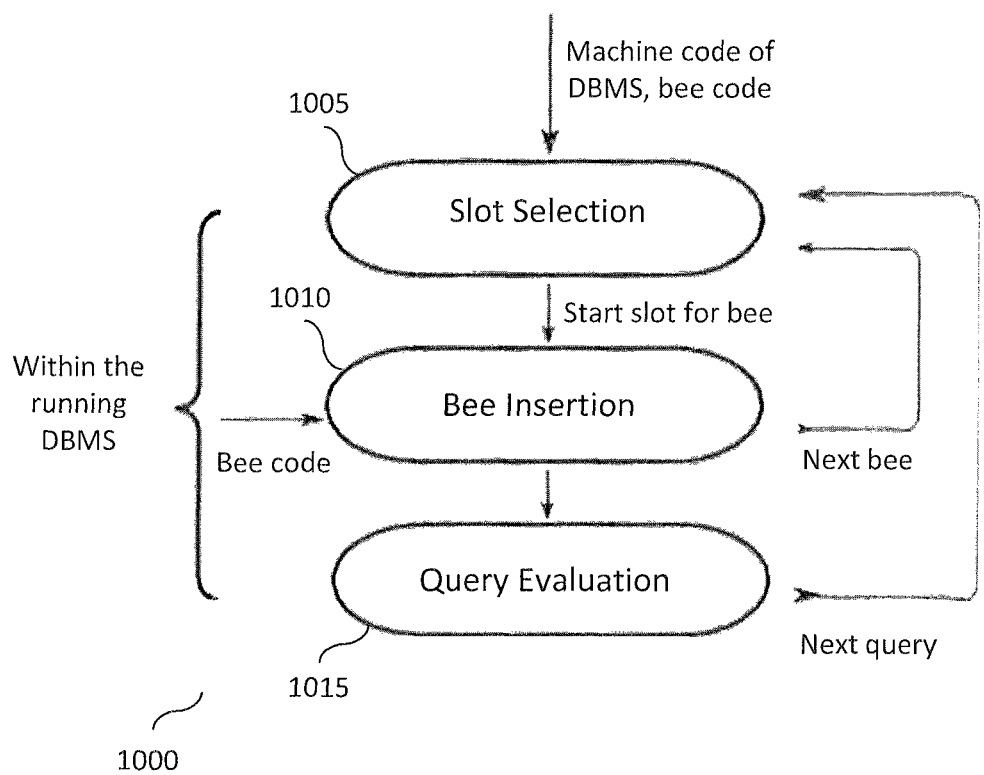
FIG. 10 is a block diagram illustrating workflow of profile-agnostic bee placement algorithms with an embodiment of the present invention.

FIG. 10 shows a block diagram illustrating workflow 1000 of profile-agnostic bee placement algorithms with an embodiment of the present invention. As shown in FIG. 10, the workflow comprises a slot selection phase 1005, a bee insertion phase 1010, and a query evaluation phase 1015, all of which occur while the DBMS is running. The slot selection phase 1005 and bee insertion phase 1010 can be done at query optimization time just before evaluating the query. The slot selection phase 1005 receives static information, specifically the machine code of the DBMS, which provides the address of the caller of each bee, and the bee code, which includes the name of its caller, to decide the slot to associate, then it passes that slot number to the bee insertion phase 1010, which finds an open memory address that maps to that slot, places the bee and checks if all the bees have been placed. In some embodiments, the bee insertion phase 1010 feedbacks a next bee to the slot selection phase 1005 to start the slot selection process again. In some embodiments, the query evaluation phase 1015 actually performs the query, calling whatever spiffs were created for that query, and then sends a next query to the slot selection phase 1005 to start the slot selection process again.

These algorithms do not utilize information about the query to be executed. Because of the limited information utilized, they are not expected to perform well under every situation. Yet they serve as a good starting point to explore the problem due to their simplicity.

Slot Selection phase 1005: This phase yields the slot that the bee's address should map to. In some embodiments, this phase involves a SlotZero Algorithm and a NextToCaller Algorithm. SlotZero Algorithm always returns a location that maps to cache slot zero. This algorithm is expected to perform terribly for the following reason: both inter-bee conflicts and DBMS-bee conflicts are going to occur, as long as there are more than four bees (the assumed slot associativity). NextToCaller Algorithm first finds the address of the bee's caller function by examining the machine code. Then it finds the slot this address maps to. This is called the caller slot. Next, this algorithm calculates the size of bee in terms of cache lines and returns the slot that is immediately before the caller. Specifically, bees are grouped with their callers. NextToCaller Algorithm reduces inter-bee conflicts in comparison with SlotZero, yet the DBMS-bee conflicts remain unaddressed.

SPP-Guided Algorithms

In this section of the disclosure, several placement algorithms that utilize a slot pressure profile (SPP) are introduced.

Slot Pressure Profile Taxonomy: A Slot Pressure Profile is an array of integers, one for each cache slot in an identified cache. It is named with the following format: "per-<granularity> <source> <cache> <what> slot pressure profile" (or SPP).

granularity indicates at which granularity the numbers are collected. There are five possible granularities: function (over the execution of a function), operator (over the execution of an operator node in the plan tree), stage (over the execution of several operator nodes), query (over the execution of the whole plan tree), or workload (over the execution of several queries).

source indicates where the numbers come from. A binary SPP contains values that are calculated from the binary executable without running it. A raw SPP contains values that are output from a profiling tool during the execution of a specified workload. A reference SPP contains values that are computed over other SPP(s) by an algorithm.

cache indicates which cache the numbers refer to. It can be (level 1) I-cache, (level 1) D-cache, or (integrated) L2-cache.

what indicates what the numbers represent. In general, they all represent the likelihood of cache pressure at this slot. Details of how and why a specific value is chosen when each algorithm is introduced will be reviewed in details. For example, in disclosure of SPP Generation Phase below, an algorithm is introduced that uses an function count SPP, in which each slot is associated with a count of the functions that contribute cache pressure to that slot.

As examples of the full names of such profiles, the per-function binary I-cache function score SPP and the per-query reference I-cache active-set SPP are disclosed in two of the algorithms below.

Figure 11:
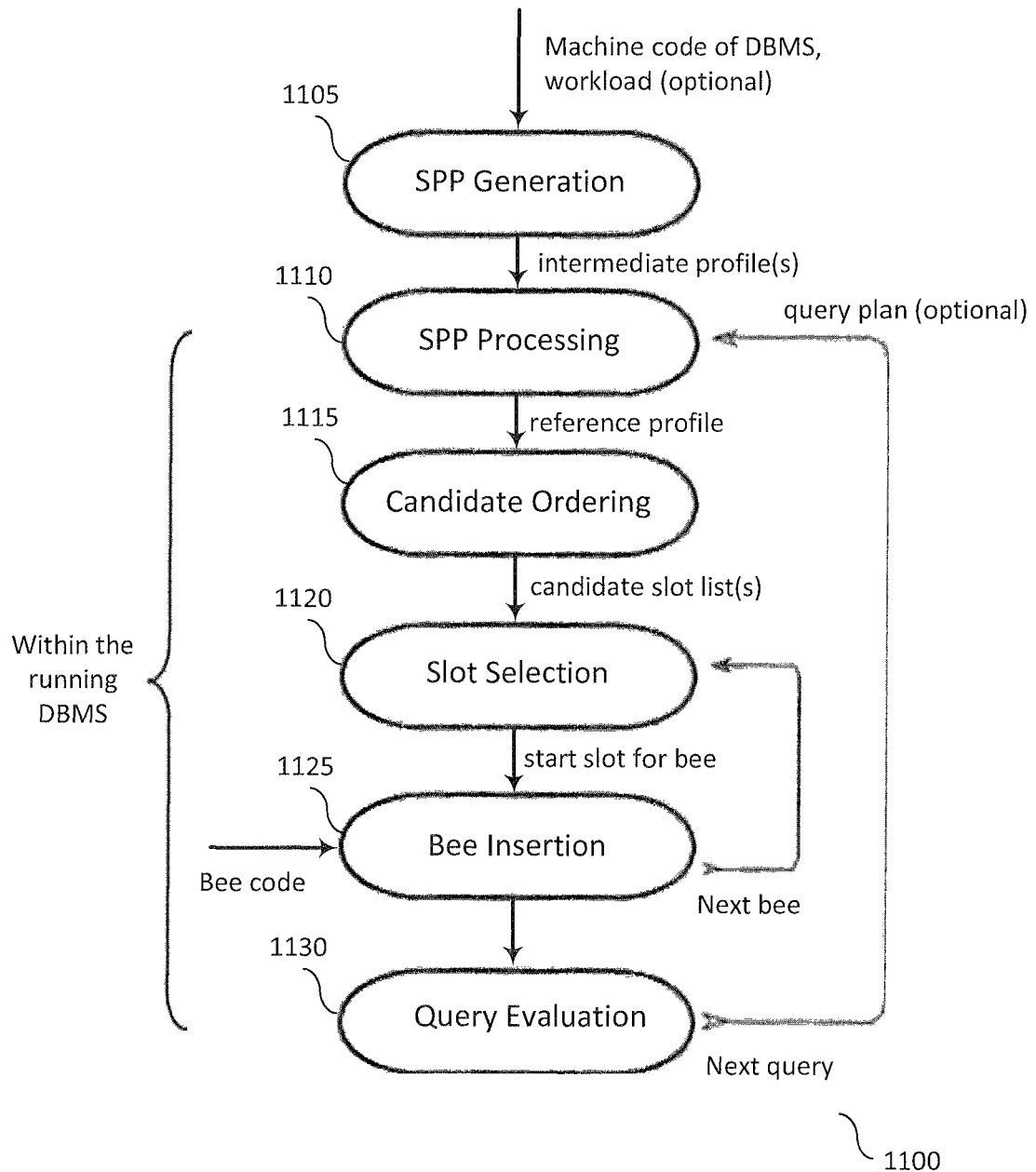
FIG. 11 is a block diagram illustrating workflow of SPP-guided bee placement algorithms with an embodiment of the present invention.

Workflow of SPP-guided Algorithms: FIG. 11 shows a block diagram illustrating workflow 1100 of SPP-guided bee placement algorithms with an embodiment of the present invention. The workflow 1100 comprises six phases: a SPP generation phase 1105, a SPP processing phase 1110, a Candidate ordering phase 1115, a slot selection phase 1120, a Bee insertion phase 1125, and a query evaluation phase 1130.

In the SPP Generation phase 1105, the algorithm generates at DBMS compile time one or more SPPs by assigning weights to a binary SPP with external knowledge from the programmer, collecting a raw SPP over the DBMS executing a workload, or computing a reference SPP. This phase takes time but is done statically, before the DBMS starts. The remaining phases are lightweight and occur within the DBMS as part of the query optimization phase, so that the bees are placed when query execution commences. Each algorithm creates its own reference SPP from the provided (intermediate) SPP(s) in the SPP Processing phase. Each algorithm then generates a list of candidate slots in the Candidate Ordering phase by analyzing the reference SPP from the previous phase. The candidate slot list contains a sequence of slot numbers that will be used to successively locate bees (a slot could be present several times in this list). (The MaxResidency algorithm emits several lists; the rest emit a single list.) The Slot Selection, Bee Insertion, and Query Evaluation phases work as before.

The input to SPP Generation phase 1105 is the binary of the DBMS. The output is a single intermediate SPP. In embodiments, the SPP Generation phase 1105 involves three distinct SPP generation algorithms, each utilizing different input workloads.

1. Binary Function Score Algorithm

In this SPP generation algorithm, a simple heuristic is used: often-used functions are the focus, as indicated by the workload. Often-used functions are chosen as fifty functions with the highest exclusive instruction count—that is, without including its children—as measured by callgrind. Callgrind is an analysis tool that counts function calls and the CPU instructions executed within each call and builds a function callgraph. Callgrind may be used for both CPU and cache profiling. One may define often-used functions in other ways. Those often-used functions are given a higher score, 100, to distinguish them from the less used ones, which are given a score of 1. The sum of the scores of all functions that include that slot are then assigned to each slot, to construct a per-workload binary I-cache function score SPP.

2. Function Count Algorithm

There's a weakness in the above mentioned Binary Function Score Algorithm: it uses only global information, and therefore the specifics of the query to be eventually evaluated cannot be exploited. During query evaluation, a relational operator implemented by the DBMS (such as hash join) can invoke many functions, through a long call chain, through function pointers, etc. Hence, the first step in this algorithm is to identify all the functions that may be invoked by each operator. Because of the complexities of the DBMS that might confuse static analysis, dynamic analysis is used instead, though importantly, at DBMS compile time, to provide an estimate of these functions.

The input to this stage is the DBMS binary and the workload. The output is a single intermediate SPP per operator. The call graph for DBMS is first obtained for executing the representative workload, which involves the operators being cared about. Then a breadth-first search is performed for each query evaluation operator to identify all the functions it may call. However, an operator A sometimes reaches a function F through another operator B; in that case, F shouldn't be considered to be reachable by A.

Then for each identified function, this algorithm generates a per-function binary I-cache function score SPP by assigning 1 to its associated slots. Adding up the SPPs for an operator yields a per-operator reference I-cache function count SPP.

3. MaxResidency Algorithm

There are two problems with the above algorithm. The first is that both hot and cold code may exist within the same function, yet those slots are not differentiated, say, by using instruction counts. The second is even if the algorithm is modified to utilize instruction counts, the number for a particular slot would be an aggregate over those functions, and thus doesn't differentiate a single function with many instructions, which will generate only compulsory misses, from multiple functions, which may generate capacity and conflict misses. Thus in the first case, that number would overestimate cache pressure.

The input to this stage is the DBMS binary and the workload. In addition to one intermediate SPP per operator, the output has one more SPP involving the bee invocation code. It is first discussed how to compute the per-operator reference I-cache MaxResidency SPPs, that will be the one of the output. As pointed out in Section: Problem to be solved, knowing the size of working set at each slot is a great help in predicting cache pressure. However, this number is not available at DBMS run-time. To make matters worse, state-of-the-art profiling tools only give the aggregate counts for the target process at each cache level, which is too coarse-grained for the purposes. The number of counts and misses at the cache slot level are able to be measured. Even with this extension, the information is still insufficient for estimating the working set size in the presence of bees. A slot with a low number of misses may still be full, such that adding a bee to that slot will evoke many misses, due to DBMS-bee conflicts and perhaps inter-bee conflicts.

The MaxResidency algorithm makes a prediction of the size of the working set. In the following discussion, let W denote the associativity of the I-cache.

Define a residency of an address accessed within a particular execution (that is, of the workload), to be the number of times that that address was accessed before it was evicted. If an address was read into the cache multiple times, then each section will contribute a residency, and this address will be associated with a sequence of that many residencies.

Define the max residency of a slot (not an address) to be the top if residencies of all memory addresses that map to this slot. The W residencies might not all come from different addresses.

From these W integers, compute an estimated occupancy, a number between 0 (no cache lines were occupied by any address, which will be highly rare) and W+1 (implying that there was a lot of thrashing at this slot).

The pseudocode of the MaxResidency algorithm is presented in Algorithms 1 and 2, using the max residency of each cache slot and instruction count SPPs produced by an extended cachegrind. Each instruction count SPP is collected over the execution of a specific DBMS query operator, hence it is a per-operator raw I-cache Instruction count SPP. The instruction count SPP and max residency of each cache slot are generated at the same time. From them, a per-operator reference I-cache MaxResidency SPP is computed. In some embodiments, an exemplary code for MaxResidency SPP generation is shown in Table.1 below.

TABLE 1

Algorithm for MaxResidency SPP generation
Algorithm 1 MaxResidency SPP generation

```
1: map<slot, list> values;
2: int[ ] MaxResidency_size(
       int[ ] instruction_countSPP,
       map<slot, list> max_residencies)
3: int[ ] MaxResidencySPP;
4: int numberOfSlots = MaxResidencySPP.length( );
5: int instruction_threshold =
       instruction_countSPP.average( ) × pressure_threshold;
6: for i=0 to numberOfSlots do
7:    MaxResidencySPP[i] = estimate_occupancy(
          max_residencies[i],
          instruction_countSPP[i],
          instruction_threshold);
8: end for
9: return MaxResidencySPP;
```

Two parameters are used in this algorithm. The first, pressure threshold, is the ratio of the instruction count at a slot to the average instruction count of all slots. This parameter is considered to constitute pressure for the associated slot. A value of 0.05 is used. A low value ensures most cache slots are further considered.

The second, residency threshold, is the ratio of the residency to the total instruction count at this slot that is considered long enough to occupy the cache line. A value of 0.15 is used. This value should not be greater than 1/W (for example, 0.25) to be meaningful. The lower it is set to, the more the algorithm considers a residency to be in the main loop. Note that these parameters are subjective. It will be seen that these specific values obtain good performance.

The MaxResidency algorithm first computes an instruction threshold, to identify slots that are accessed often enough to potentially incur cache pressure. Then it checks the max residency of this slot. If one residency accounts for 15% of the total counts at this slot, this residency is considered to be in the working set and estimated occupancy at this slot incremented by 1.

TABLE 2

Algorithm for single-slot MaxResidency occupancy
Algorithm 2 single-slot MaxResidency occupancy

```
1: int estimate_occupancy (list max_residency,
       int slot_total_count,
       int instruction_threshold)
2: int occupancy = 0;
3: if slot_total_count<instruction_threshold then
4:     return 0;
5: end if
6: for i=0 to W do
7:     if max_residency[i]/slot_total_count >
           residency_threshold then
8:         occupancy += 1;
9:     end if
10: end for
11: if occupancy == 0 then
12:     return W+1;
13: end if
14: return occupancy;
```

MaxResidency Algorithm is reviewed with three concrete examples. For simplicity, it is assumed that W is 4 and the cache has only two slots: 0 and 1, with a memory address mapping to a cache slot by last bit.

Example 1: Instruction Sequence with a Small Working Set

For this first example, consider an instruction sequence $S_1$ consisting of ten repetitions of address 11 followed by address 21 (denoted 11, 21), both of which map to slot 1. Thus the size of the working set of $S_1$ at slot 1 is thus 2 because there are two distinct blocks. How does MaxResidency algorithm infer 2? It first sees that average instruction count is 10 (total instruction count/number of cache slots). It then sets the threshold value to be 0.5 (pressure threshold× average instruction count; cf. line 5 in Algorithm 1) to filter out slots with few accesses. Slot 0 has 0 (<0.5) instructions so gets 0 as estimated occupancy immediately (cf. line 4 in Algorithm 2). Slot 1 has 20 (>0.5) instructions so should be further processed. The max residency of slot 1 is <10, 10, 0,0>. 10/20 is larger than the residency threshold, so the algorithm concludes that slot 1's estimated occupancy is 2 (cf. line 8 of Algorithm 2).

Now consider $S_2$, a variant of $S_1$ with successive accesses to the same memory block: an instruction sequence of ten repetitions of 11, 21, 21, 11, 11. The size of $S_2$'s working set is known as still 2. For this scenario, however, the instruction count is 50. The algorithm will thus compute an average instruction count of 25 and thus will filter slot 0 out. This time, the max residency at slot 1 is <30, 20, 0, 0>. 30/50 and 20/50 are both larger than the residency threshold. So it concludes that slot 1's estimated occupancy is 2. In both scenarios, MaxResidency's analysis is accurate.

Example 2: Instruction Sequence with a Large Working Set

Consider ten repetitions of instruction addresses 1, 11, 21, 31, 41, 51. The algorithm will compute the average instruction count as 60/2=30 and so filters slot 0 out. This time, the max residency of slot 1 is <1,1,1,1>. This indicates that thrashing is probably going on at this slot! So it concludes that slot 1's estimated occupancy is 5 (cf. line 12 of Algorithm 2). However, the actual size of slot 1's working set is known as 6. This estimate is somewhat inaccurate but nevertheless warns that this slot is already experiencing many conflicts.

Example 3: Instruction Sequence with Multiple Loops

Consider another sequence S3 followed immediate by $S_4$, where $S_3$ is ten repetitions of instruction addresses 1, 11, 21 and S4 is twenty repetitions of instruction addresses 31, 41, 51, 61, 71, 81. The algorithm will compute an average instruction count of 75 and will filter slot 0 out. This time, the max residency at slot 1 is <10,10,10,1>. (The first is residency of address 1, then address 11, then address 21; all others are 1.) Even the largest 10/150 is smaller than residency threshold. This indicates that the top W residencies do not come from the major loop. So it concludes that slot 1's estimated occupancy is 5. Based on external knowledge, the actual size of slot 1's working set is known as 7 (3+4). This example demonstrates that MaxResidency is not misguided by the small loop.

The result of this analysis is a per-operator reference I-cache MaxResidency SPP for each operator, stating the estimated occupancy of each slot, computed by running the DBMS on the workload at compile time.

Turning to the per-workload reference I-cache bee invocation profile, the second part of this phase's output. In the MaxResidency algorithm, the SPPs are collected over the same executable to make sure the layout doesn't change. This is realistic in that executables are not recompiled to accommodate bees. To obtain the workflow of stock DBMS in the layout with these added bee invocations, all bees arc disabled when the SPPs are collected. Thus, there are three groups of code: the stock DBMS code, the bee invocation code, and the bee code itself. The per-operator reference I-cache MaxResidency SPP just obtained is not aware of the bee invocation code. The algorithm though needs to know this information.

An SPP for the bee invocation code can be created by identifying their machine code fragments and their slots. Note that only one such SPP is computed, termed the per-workload reference I-cache bee invocation SPP.

SPP Processing Phase 1110

SPP Processing Phase 1110 receives the intermediate SPP obtained in SPP Generation phase 1105 and outputs a reference SPP (or profile). In embodiments, the SPP Processing Phase 1110 comprises one or more algorithms selected from Binary Function Score Algorithm, Function Count Algorithm, and MaxResidency Algorithm. These algorithms infer the cache pressure, construct a reference SPP, and give the query plan. In embodiments, each algorithm calculates its reference SPP differently.

Binary Function Score Algorithm

The Binary Function. Score Algorithm doesn't do much in SPP Processing Phase as the per-workload binary I-cache function score SPP is fixed for all queries.

Function Count Algorithm

The Function Count Algorithm takes into consideration that for each particular query, only the functions related to the plan's operators will be executed, and the number of times a function is executed is exactly that operator's cardinality. The algorithm constructs the reference SPP by multiplying the SPP of each operator in the plan by its input cardinality, then summing up these per-operator SPPs to get a final SPP, the per-query reference I-cache inner-loop score SPP.

MaxResidency Algorithm

Many DBMSes use the so-called "Volcano" query evaluation model that delivers a result tuple by traversing nodes in the query plan tree, each returning a tuple for use in the parent node. Each node in the query tree is evaluated to produce a tuple, and so to determine the cache pressure for the entire query, the per-operator SPPs can be added up, for those operators appearing in the query plan, to obtain the SPP of the whole query.

However, there's another opportunity for optimization. PostgreSQL utilizes the concept of a blocking operator, which calls its child operators potentially many times, thereby computing the entire result of its subquery before returning its first result. Subsequent calls will just return successive tuples, without further evaluation of its child operators. Each blocking operator creates a stage, a subset of the operators in the plan that all execute to completion, while the rest of the operators wait. The only exception is that the root operator of the query plan tree always creates a stage even it is not a blocking operator. This provides an opportunity to estimate the cache pressure of each stage.

Figure 12:
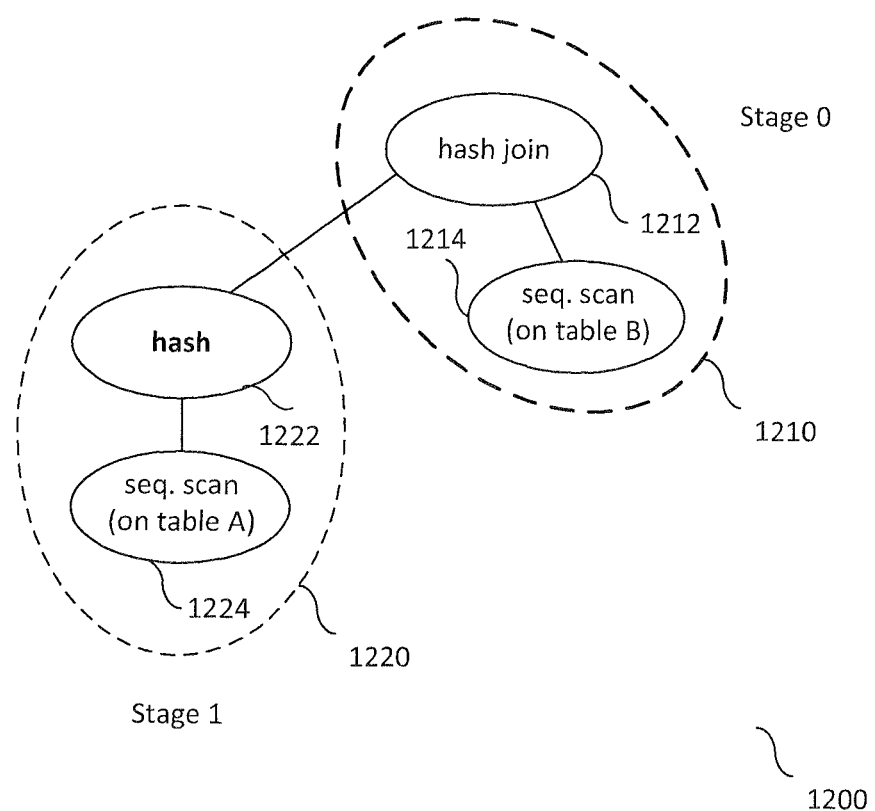
FIG. 12 is a schematic diagram showing stages of a query plan tree with an embodiment of the present invention.

FIG. 12 is a schematic diagram 1200 showing stages of a concrete query plan tree with an embodiment of the present invention. In this figure, hash (1222) is emphasized as it is a blocking operator. As shown in FIG. 11, the diagram has a Stage 0 (1210) and a Stage 1 (1220). Stage 0 (1210) is rooted at the root hash join 1212 and also comprises a sequential scan operator 1214 (applied to table B) that is coupled to the hash join 1112. Stage 1 (1220) is rooted at hash 1222 and also comprises a sequential scan operator 1224 (applied to table A) that is coupled to the hash 1222. The root hash join 1212 couples to the root hash 1222. The operator node where a bee is invoked the bee operator and the operators that are in the same stage as the bee operator are termed the active operators.

Note that there well could be stages below this blocking operator; these stages will be executed in totality during the first call of the blocking operator, but will not generate cache pressure after that, and thus do not contribute cache pressure for this stage. Similarly, for the stage above the blocking operator, which ultimately calls the blocking operator, once the lower stage returns, the active operators in that lower stage will no longer contribute cache pressure for the upper stage. Similarly for the stages beside this stage, in the query tree. Hence, only operators within the stage, the active operators, contribute cache pressure.

The MaxResidency algorithm first identifies the stages within the plan tree for the query, computes an SPP for each stage, and then finally uses those SPPs to compute an SPP for each bee caller, which is then used to place bees to be invoked by that caller. There are several subcases to consider:

Subcase 1: If a particular bee is invoked (either directly or indirectly) in a single stage, the SPP associated with that stage is then used to place that bee.

Subcase 2: It may be the case that two instances of the same operator within a query plan each call a bee, but each bee would be specific to that operator, and so in this case there are two specific bees, each associated with one of those operator instances. Each of those bees would be placed using the associated per-stage SPP.

Subcase 3: It may also be the case that a specific bee, specialized from particular invariant values, may be invoked (perhaps indirectly) by multiple operator nodes. In that case, this algorithm will conservatively treat the combination of the requisite SPPs of those stages as the resulting SPP: each slot would have the maximum of the associated slots of the constituent SPPs. The rationale is that each stage will execute separately, and so the bee would see only the pressure from one stage at any point in its execution.

Recalling the bee invocation code in Section MaxResidency Algorithm in SPP generation phase, because operators within the same stage can execute the bee invocation code without conflict and operators in different stages do conflict, the bee invocation SPP should be added to the per-operator SPPs to render a per-stage reference I-cache MaxResidency SPP for each stage.

Candidate Ordering Phase 1115

The Candidate Ordering Phase 1115 accepts a reference SPP from the previous phase and produces a candidate slot list by sorting the values in the SPP. (For MaxResidency, this is on a per-stage basis.) Algorithm 3 finds the next candidate slot from a SPP. Assuming that the bee takes consecutive blocks, Algorithm 3, as shown in Table 3, will choose the starting slot for the next bee, a slot that exhibits the least estimated cache pressure, according the SPP.

The inputs to this algorithm are the beeSize, which is the number of 64-byte blocks needed to accommodate the bee, and usedSlots, which contains slots that have been occupied by earlier bees; this set starts out empty. To find the next slot in which to accommodate a bee, the algorithm calculates for each slot its estimated cache pressure: the maximum value of slots Taken consecutive slots following it, if the slot hasn't been used yet. (Repeating slots will be dealt with soon.) An array extraImpact records the estimated cache pressure of each slot. The minimum value in extraImpact (of this additional bee) is identified and its index is returned as the candidate slot number. Just before returning the candidate slot, the occupied slot(s) are added to usedSlots to avoid conflict with future bee placement.

In some embodiments, some implementation details are omitted in Algorithm 3 as they are not tightly related to the idea and are straight-forward. For example, a boundary check is needed near the end of array SPP, when locating a large bee in one of the last slots.

Algorithm 3 returns only the next candidate slot. To perform Candidate Ordering, this algorithm is successively invoked. The caller is responsible for resetting the usedSlots variable when it gets full.

This algorithm works fine for the Binary Function Score Algorithm and the Function Count Algorithm.

TABLE 3

Algorithm for SPPGuided Next Candidate
Algorithm 3 SPPGuided Next Candidate

1: int SPPGuided_NextCandidate (int[ ] SPP,
    int beeSize, set usedSlots)
2: set affectedSlots;
3: int startingSlot;
4: int[ ] extraImpact;
5: int numberOfSlots = SPP.length( );
6: for i=0 to numberOfSlots do
7:     if i ∈ usedSlots then
8:         continue;
9:     end if
10:    affectedSlots.clear( );
11:    for j=0 to beeSize−1 do
12:        affectedSlots.add(SPP[i+j]);
13:    end for
14:    extraImpact[i] = affectedSlots.max( );
15: end for
16: for k=0 to beeSize−1 do TABLE 3-continued Algorithm for SPPGuided Next Candidate
Algorithm 3 SPPGuided Next Candidate

```
17:    usedSlots.add(startingSlot+k);
18: end for
19: startingSlot = extraImpact.min( ).getIndex( );
20: return startingSlot;
```

The MaxResidency Algorithm, on the other hand, requires some extra effort with the usedSlots variable to ensure that the right number of bees associate to each cache slot. As an example, assume the bee's size is 1 block, the cache's associativity is 4, and the MaxResidency SPP for that stage has 3 in slot A and 1 in slot B, which means slot A can accommodate one bee while slot B can accommodate three bees. The algorithm will first suggest using slot B then slot A. At this point, only slot A is needed to be removed, and continue. Slot B would be removed after it had been indicated three times. Once this occurs and slots are ran out, the process simply returns to generating a uniform sequence of bee locations for the remaining bees.

The evaluation involves several independent and several dependent variables. The hardware configuration is one of the independent variables. An I-cache configuration of a 128-slot, 64B-block, 4-way associative L1 cache (separate instruction and data caches) and a 8192 slot, 64B block, 16-way associative L3 cache (combined instruction and data) is adopted for both cachegrind simulation and for empirical evaluations on real hardware. (The physical machine has an additional intermediate-level cache: a 512 slot, 64B block, 8-way associative combined cache.) The physical machine has 7 GB of main memory. The other independent variables are the training workload, the specific queries being evaluated, the size of bee code, the number of DBMS bee-invocation functions (50), the total number of invoked bees, and the placement algorithm used.

The dependent variables are the miss rates (that is, scaled by number of references, and thus is a percentage) at L1 I-cache and L2 levels, as those are the metrics that will be most impacted by bee placement, and the bee placement algorithm time.

The bee code used is a constant sequence of 10 instructions (that is, there is only one bee that is to be replicated as needed) that does not actually speed up the DBMS. The point is, a realistic bee improves DBMS performance, but this improvement is reduced by cache misses as a result of bad placement. Thus the actual bee code is not relevant to the purposes, only that it runs some code, thereby generating instruction fetches.

Evaluation Experiment Protocol

Figure 13:
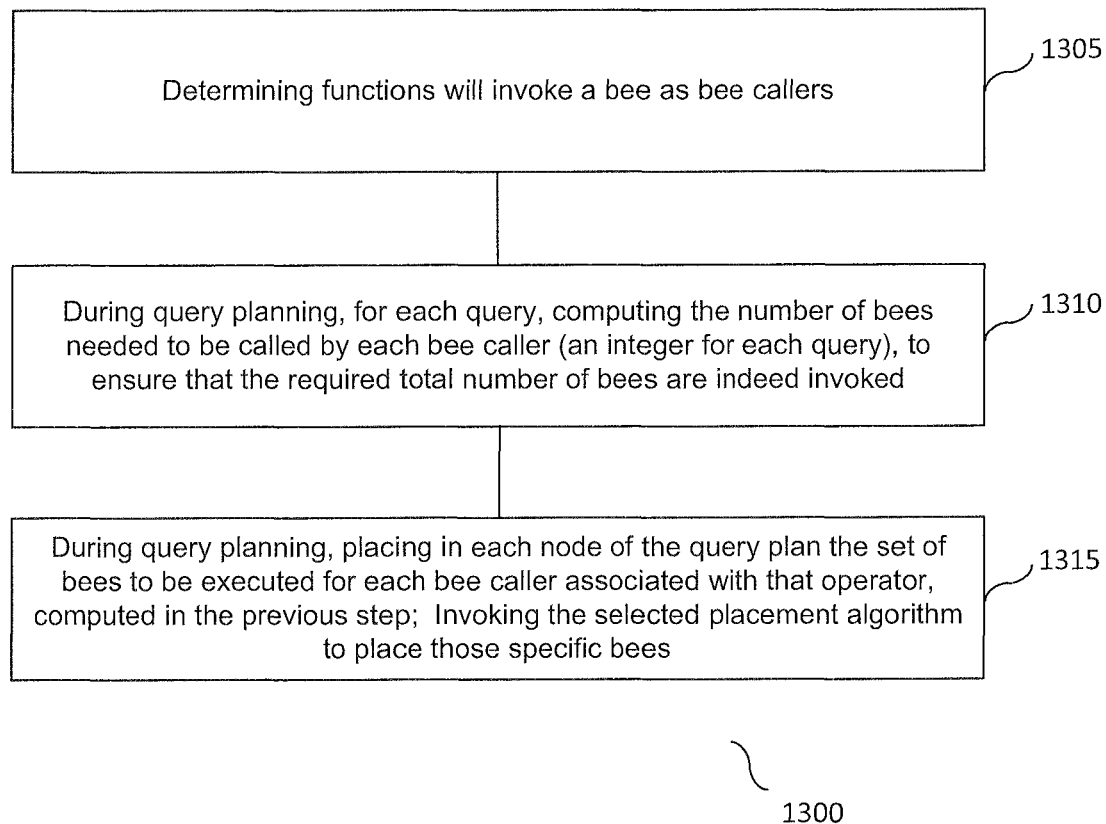
FIG. 13 is an exemplary flow diagram for the evaluation of cache pressure when introducing code into a DMBS with an embodiment of the present invention.

FIG. 13 shows an exemplary flow diagram 1300 for the evaluation. As shown in FIG. 13, the experiment protocol consists of three consecutive steps. Step 1305 is done statically, at DBMS compile time, and Steps 1310 and 1315 are done dynamically, during query planning.

The first step 1305 determines which functions will invoke a bee; such functions are termed the bee callers. The DBMS (PostgreSQL 9.3.10) are first compiled with gcc (version 4.6 used, with the -O2 option). Since the goal of micro-specialization is to optimize often-used code, the top fifty most-used functions are then identified within query evaluation from executing the training workload sequentially (TPC-H queries, omitting the five queries listed in the next section). For each so-identified function, a call is added in the source code to bee code (one or more calls, depending on the number of bees). A call graph profile is also obtained by running callgrind on that same workload. An operator-caller mapping is then generated by associating with each operator those functions that are called directly or indirectly by that operator. If two operators can reach the same function, the function will be associated with both operators.

The second step 1310 and third step 1315 are performed when the stock and specialized versions of PostgreSQL are ran, with the latter having the bee callers invoke the specified number of bees, generating relevant performance statistics. Here the TPC-H queries are also used, so that the requested number of bees will indeed be called.

In some embodiments, a constant number of bees (400) is placed for each query to generate a significant but representative amount of cache pressure for the algorithms to contend with. Note that more than 512 bees could overwhelm the physical instruction cache (as that is the number of slots).

The second step 1310 occurs during query planning, for each query. It computes the number of bees needed to be called by each bee caller (an integer for each query), to ensure that the required total number of bees (an independent variable) are indeed invoked. Specifically, using the operator-caller mapping from the previous step, this step divides the total number of bees by the number of bee callers. (Functions that can be reached from multiple operators will be appropriately given multiple sets of bees.) When bees remain, that many bee callers are picked randomly to call one more bee. This implementation guarantees that each query will have exactly the same number of bees, though different sets of bees, determined by the operator(s) used.

Take query 6 as an example. This query utilizes 81 bee callers. Each bee caller is thus assigned at least 400/81=4 bees, with 400 mod 81=76 effective bee callers chosen randomly to invoke one additional bee.

In the third step 1315, also during query planning, the set of bees to be executed for each bee caller associated with that operator, computed in the previous step, are placed in each node of the query plan. The selected placement algorithm is then invoked to place those specific bees (some of the algorithms utilize the query in this placement).

The focus is on I-cache miss rate, when bees are added to the stock query execution. Note that this is different from what will happen in practice, in two ways. First, each query will involve a different number and different set of bees. Due to the complexity of the DBMS, and the desire to have some uniformity in the experiments, the simpler arrangement of 400 identical one-slot bees are set up to be invoked by each query. Secondly, in proactive each query will replace stock code with a more efficient bee, whereas the bees are added to the stock code, which actually puts a greater burden on the placement algorithms, as there was more cache pressure with the added bees. Given this experimental arrangement, it doesn't make sense to measure query time. Rather, the focus is on I-cache miss rate for each query, as that query invokes 400 added bees at 50 invocation sites within the DBMS.

In summary, the objective of the disclosed cache placement algorithms in this setting is to affect the minimum cache pressure, as indicated by I-cache miss rate. Using a placement algorithm that does so should also perform well in the more realistic setting of a variable number of variable-sized bees, as all the algorithms attempt (with varying degrees of success) to place the added bees in valleys identified by the profiles available to that algorithm.

Algorithm-Specific Details

In the experiments, each bee can fit in 64 bytes, or one slot. To evaluate the algorithms, TPC-H scale factor 1 is used as the representative workload omitting queries 2, 17, 20 and 21 because they ran too slowly, and omitting query 15 because that query is a view. Because cache performance are optimized, the scale factor is not relevant, as long as the data does not fit in the L2 cache, which is the case for scale 1.

For the SPP-guided algorithms, except for MaxResidency, TPC-H is also used, scale factor 1, as the training workload. This is of course unrealistic. This is done because it presents the best-case scenario for these algorithms, of having the training workload be the same as the evaluation workload.

For the MaxResidency algorithm, for the training workload, simple queries are manually created on a simple database, with each query ideally having a single operator, in order to generate the per-operator profiles. (In PostgreSQL, some operators always are associated with another, such as the aggregate operator is always associated with some kind of scanning operator. Collecting this information required additional modifications to cachegrind.)

Thus, best-case performance of other algorithms is compared to a realistic case for the MaxResidency algorithm.

Results and Analysis

The weighted and unweighted average I-cache miss rate across the TPC-H queries is first examined, provided in the last two rows of Table 4. The unweighted average is just the average of cache miss rate over the queries (thus treating them equally), while the weighted average is weighted by each query's instruction count, thus queries 1 and 18 contribute more than rest to that average. The fastest algorithm for each query in boldface is indicated. Note that MaxResidency performs significantly better than all of the other algorithms in both cases.

that of the best algorithm (for that query) was minimal. Query 1 happens to have only two phases, so MaxResidency's ability to handle complex query trees is not fully utilized. (Note that even though this query incurs a lot of instructions, MaxResidency's miss rate for this query is close to that of BinaryFunctionScore.) Finally, for query 18, It is not sure why BinaryFunctionScore is so much better. The MaxResidency threshold setting adopted (0.15) might play a role. That said, for most queries MaxResidency significantly bettered BinaryFunctionScore.

The number of bees is also varied: 200 as a light workload; 400 as a medium workload; and 500 and 1000 as heavy workloads. With all, MaxResidency produced the best results, for both weighted and unweighted. To indicate how well MaxResidency works in other cases, the weighted cache miss rate average is mentioned: 0.213% for 200 bees; 0.275% for 500 bees; and 0.498% for 1000 bees.

Figure 14:
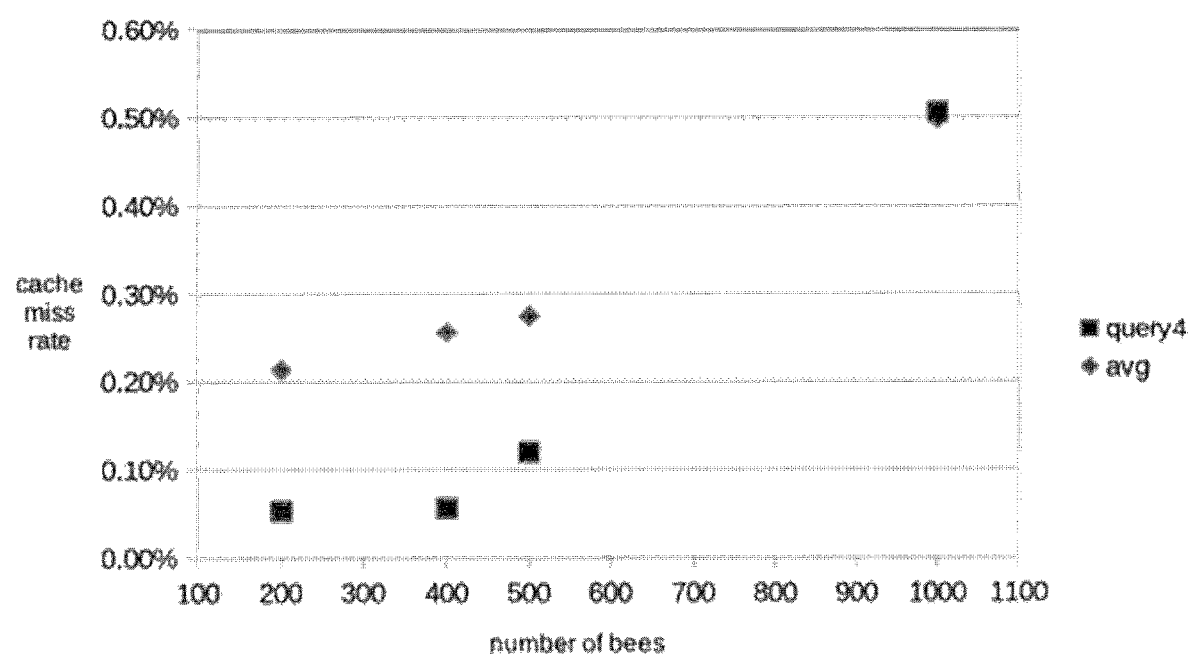
FIG. 14 is an illustration showing impact of increasing number of bees on cache miss rate percentage with an embodiment of the present invention.

When the number of bees inserted for a query is varied, it can be seen how MaxResidency cache miss rate changes in FIG. 14. Query 4 is marked with square while weighted average is marked with diamond (it is shown query 4 as it has the most significant change as the number of bees is varied). At 1000 bees, their cache miss rates between q4 and the average, demonstrating that for query 4 the cache miss rate goes up sharply after the I-cache slots have been filled up. The transition appears to be between 400 and 500. This makes sense, because the I-cache has 512 slots and DBMS stock code of course (partially) occupies many of them.

Several other interesting phenomena are observed:

In an earlier experiment with only one bee caller, NextToCaller achieved the minimum I-cache miss rate for

TABLE 4

I-cache miss rate (as a percentage) across queries, with lowest highlighted in boldface)

| | | Cache Placement Algorithms | | | | |
|---|---|---|---|---|---|---|
| query | Instruction | SlotZ | NextToC | BinaryFunction | Function | MaxReside |
| 1 | 247,660,74 | 2.70 | 3.71 | 0.424 | 0.518 | 0.452 |
| 3 | 19,353,663 | 0.94 | 0.607 | 0.491 | 0.270 | 0.213 |
| 4 | 23,510,390 | 1.48 | 0.773 | 0.313 | 0.279 | 0.0564 |
| 5 | 15,196,049 | 0.86 | 0.399 | 0.205 | 0.194 | 0.111 |
| 6 | 19,676,968 | 3.33 | 4.05 | 0.415 | 0.168 | 0.144 |
| 7 | 18,415,720 | 0.93 | 0.408 | 0.211 | 0.201 | 0.150 |
| 8 | 10,761,252 | 0.81 | 0.136 | 0.0946 | 0.103 | 0.0673 |
| 9 | 56,701,641 | 0.39 | 0.217 | 0.151 | 0.137 | 0.153 |
| 10 | 29,830,976 | 0.77 | 0.249 | 0.216 | 0.145 | 0.106 |
| 11 | 2,337,877, | 0.74 | 0.326 | 0.242 | 0.263 | 0.218 |
| 12 | 20,837,423 | 1.42 | 0.306 | 0.0864 | 0.0546 | 0.0511 |
| 13 | 18,137,990 | 0.78 | 0.657 | 0.408 | 0.365 | 0.0746 |
| 14 | 13,760,553 | 1.99 | 0.467 | 0.122 | 0.0841 | 0.0847 |
| 16 | 32,161,032 | 0.18 | 0.163 | 0.0907 | 0.0737 | 0.0809 |
| 18 | 62,068,812 | 0.59 | 0.321 | 0.0885 | 0.197 | 0.163 |
| 19 | 16,833,167 | 1.40 | 0.283 | 0.150 | 0.141 | 0.120 |
| 22 | 5,538,705, | 0.84 | 0.191 | 0.188 | 0.270 | 0.115 |
| weighted | 36,046,057 | 1.66 | 1.83 | 0.288 | 0.312 | 0.256 |
| unweigh | N/A | 1.19 | 0.780 | 0.229 | 0.204 | 0.139 |

Notice that NextToCaller is inferior to SlotZero in terms of the weighted average metric, which is unexpected. This anomalous result occurs because SlotZero only affects the cache pressure on one slot. NextToCaller, however, spreads the cache pressure across no more than 50 cache slots (recall that this experiment introduces 50 bee callers into the DBMS); thus slots could suffer from thrashing and attain even worse performance than SlotZero.

It is shown that out of the 17 queries in the benchmark, MaxResidency excels for 12 queries. For queries 9, 14, and 16, the performance difference between MaxResidency and query 6. However, its execution time was almost twice as longer as the others. The reason for such significant slow-down is that NextToCaller's L2-cache miss rate is significantly higher than others algorithms. As L2-cache misses are much more expensive that 1-cache misses, this effect dominates the run time. L2-cache misses in the table discussed above (with fifty bee callers) is not shown because the I-cache misses in Table 3 are spread across a large number of L2 cache slots, resulting in a uniformly low L2-cache miss rate, less than 0.012% in all cases.

Each algorithm is implemented in a separate C file and one binary is installed per algorithm. The assumption is that all binaries will have similar cache behavior if no bee is invoked. This assumption was proven wrong when MaxResidency's performance is studied and it is found that half the cache misses came from code placed by gcc. The conflict was between the stock DBMS code, bee invocation code, and actual bee execution during query evaluation. This problem is addressed by optimizing the length of bee invocation code so it has minimal conflicts with stock DBMS code.

It is concerned that a placement algorithm's execution time could offset its benefit in terms of reduced cache miss rate. In the end, it turned out that even the most complicated placement algorithm takes very little time, 0.02 seconds in the worst case. Since it has constant number of input profiles (one per available operation), all of the same length (number of slots), the its complexity is linear in the number of bees, and for MaxResidency, also linear (additively) in the number of stages in query plan tree, both of which are small.

In summary, these optimizations result in MaxResidency performing quite well across the range of TPC-H queries, for a rather large number of bees.

Some of the algorithms introduced in Section: Related Previous Work are reviewed again. The algorithms include those that could possibly be applied in a dynamic setting, and evaluate specifically how the presented MaxResidency algorithm compares.

Huang et al. [X. Huang, S. M. Blackburn, D. Grove, and K. S. McKinley. Fast and efficient partial code reordering: Taking advantage of dynamic recompilation, In *Proc. International Symposium on Memory Management*, pages 18-192, New York, N.Y., 2006] proposed Code Reordering, focusing on direct-mapped caches, with an associativity of 1. Sherwood et al. [T. Sherwood, B. Calder, and J. Emer. Reducing cache misses using hardware and software page placement, In *Proc. International Conference on Supercomputing*, pages 155-164, New York, N.Y., 1999] proposed a Conflict Matrix based coloring, this is very similar to the Temporal Relational Graph [N. Gloy and M. D. Smith. Procedure placement using temporal-ordering information. *ACM Trans. Program. Lang. Syst.*, 21(5):977-1027, September 1999] idea. They also fail to consider the cache associativity. In contrast, the disclosed algorithms apply to caches with higher associativity.

Whaley et al. [J. Whaley. Partial method compilation using dynamic profile information. *ACM SIGPLAN Notices*, 36(11):166-179, October 2001] proposed that dynamic analysis of control flow, by collecting profiles at run-time, which can be very expensive. The disclosed algorithms, for those that use profiles, require only that they be of a representative workload and are created at compile time.

Chen et al. [J. B. Chen and B. D. Leupen. Improving instruction locality with just-in-time code layout. In Proc. USENIX Windows NT Workshop, pages 25-32, 1997] developed a greedy placement strategy that relies on the invocation sequence instead of the invocation times used in Pettis & Hansen's. This approach is essentially grouping into cache slots from a finite-depth stack of activation frames. It is believed that their approach if extended to the dynamic situation would suffer from the same problem as LRU when there is a deep query plan.

Ding et al. [C. Ding and K. Kennedy. Improving cache performance in dynamic applications through data and computation reorganization at run time. In *Proc. ACM SIGPLAN Conference on Programming Language Design and Implementation*, pages 229-241, New York, N.Y., 1999] proposed Locality Grouping. But this algorithm focuses on data cache accesses and thus does not help reduce I-cache pressure.

Ding et al. [C. Ding and Y. Zhong. Predicting whole-program locality through reuse distance analysis. In *ACM SIGPLAN Notices*, volume 38, pages 245-257, 2003] propose Phase Prediction, which uses knowledge of reuse distance. Their algorithm applies only to simple dynamic patterns, whereas quite specific and complex patterns within query plans can be exploited while determining the placement.

Five placement algorithms are evaluated on I-cache miss rate and L2 cache miss rate, and one experiment on overall execution time. Concerning the 1-cache miss rate, MaxResidency was the best. Concerning the L2 miss rate, all were low, below 0.012%. Overall query time for SlotZero and BinaryFunctionScore for one query, q6, are also compared from an actual full implementation. NextToCaller demonstrated the benefit of micro-specialization at a 15% improvement (this included some slowdown from cache misses); for SlotZero, the increased cache pressure entirely obviated the benefit, due to a 1% cache miss rate. The overall placement time was minimal, less than 0.02 sec to place 400 bees, for all algorithms.

The evaluation has shown that the MaxResidency dynamic bee placement algorithm minimizes I-cache pressure for workloads with as many as 1000 bees. Thus, aggressive micro-specialization of a large number of functions invoked during query evaluation can improve query evaluation performance without concern for increased I-cache pressure and thus also L2-cache pressure, through the use of this highly-effective bee placement algorithm.

The algorithms presented in this paper all attempt to minimize instruction cache misses. Because the L2 cache is generally an integrated cache (not differentiating between instructions and data), bee placement algorithms should consider the L2 cache pressure due to first-level data cache misses. This might be able to be accommodated via appropriate L2 and data profiles, as future work. That said, when considering up to even 1000 bees, the best algorithms are able to minimize the number of L2 misses. It would be interesting to determine the number of bees needed to produce significant L2-cache pressure.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. A computer-implemented method to minimize cache pressure using slot pressure profile (SPP)-guided Algorithm, the method comprising:

generating, in a SPP generation phase, an intermediate SPP from a binary code of a database management system (DBMS);

receiving, in a SPP processing phase, the generated intermediate SPP obtained in the SPP Generation phase and outputting a reference SPP, wherein the reference SPP has a value assigned for each cache slot in a cache, whereby a cache slot value is indicative of cache pressure;

accepting, in a candidate ordering phase, the reference SPP and producing a candidate slot list related to the cache by sorting the values in the reference SPP;

deciding, in a slot selection phase, a slot number among the candidate slot list;
passing the decided slot number, in a bee insertion phase, to find an open memory address mapping to the decided slot number for a bee code, the bee code being a specialized version of a DBMS function created and loaded into the cache at run-time; and
executing, in a query evaluation phase, a query with the bee code using the open memory address found;
wherein the SPP processing phase comprises at least one of:
   a Binary Function Score Algorithm to infer cache pressure;
   a Function Count Algorithm to construct the reference SPP; or
   a MaxResidency Algorithm to give a query plan, wherein the MaxResidency algorithm comprises the steps of:
   computing an instruction threshold to identify slots that are accessed enough to potentially incur cache pressure;
   checking a max residency of the identified slots; and
   in response to the max residency reaches the instruction threshold of total counts at the identified slot, incrementing an estimated occupancy at this slot by 1, wherein the instruction threshold is a ratio of a residency to a total instruction count at a slot that is considered long enough to occupy a cache line.

2. The computer-implemented method of claim 1, wherein the SPP generation phase further comprises the step of identifying functions that are invoked by operators implemented by the DBMS, wherein dynamic analysis is used at DBMS compile time to provide an estimate of the cache pressure of the identified functions.

3. The computer-implemented method of claim 1, wherein the SPP generation phase further comprises the steps of:
   obtaining a call graph for the DBMS for executing representative workload;
   performing a breadth-first search to identify all functions the query calls;
   for each identified function, generating a per-function binary instruction cache (I-cache) function score SPP; and
   adding up the function score SPPs for an operator to yield a per-operator reference I-cache function count SPP.

4. The computer-implemented method of claim 1, wherein the SPP generation phase further comprises the steps of:
   generating at DBMS compile time one or more SPPs by assigning weights to a binary SPP; and
   collecting a raw SPP over the DBMS executing a workload.

5. The computer-implemented method of claim 1, wherein the SPP processing phase, the candidate ordering phase, the slot selection phase, the bee insertion phase and the query evaluation phase all occur at DBMS run-time.

6. A computer-implemented method to minimize cache pressure using slot pressure profile (SPP)-guided Algorithm, the method comprising:
   generating, in a SPP generation phase, an intermediate SPP from a binary code of a database management system (DBMS);
   receiving, in a SPP processing phase, the generated intermediate SPP obtained in the SPP Generation phase and outputting a reference SPP;
   accepting, in a candidate ordering phase, the reference SPP and producing a candidate slot list related to a cache by sorting the values in the reference SPP;
   deciding, in a slot selection phase, a slot number among the candidate slot list;
   passing the decided slot number, in a bee insertion phase, to find an open memory address mapping to the decided slot number for a bee code, the bee code being a specialized version of a DBMS function created and loaded into the cache at run-time; and
   executing, in a query evaluation phase, a query with the bee code using the found open memory address,
   wherein the SPP generation phase further comprising the step of:
   identifying functions that are invoked by operators implemented by the DBMS, preferably wherein dynamic analysis is used at DBMS compile time to provide an estimate of the cache pressure of the identified functions; and/or wherein the SPP generation phase further comprising the steps of:
   obtaining a call graph for the DBMS for executing representative workload;
   performing a breadth-first search to identify all functions the query calls;
   for each identified function, generating a per-function binary instruction cache (I-cache) function score SPP;
   adding up the function score SPPs for an operator to yield a per-operator reference I-cache function count SPP; and/or
   wherein the SPP generation phase further comprising the steps of:
generating at DBMS compile time one or more SPPs by assigning weights to a binary SPP; and
   collecting a raw SPP over the DBMS executing a workload; and/or
   wherein the SPP processing phase, the candidate ordering phase, the slot selection phase, the bee insertion phase and the query evaluation phase all occur with running time of the DBMS; and/or
   wherein the SPP processing phase comprises a Binary Function Score Algorithm to infer a cache pressure; and/or
   wherein the SPP processing phase comprises a Function Count Algorithm to construct a reference SPP; and/or
   wherein the SPP processing phase comprises a MaxResidency Algorithm to give a query plan, wherein the MaxResidency algorithm preferably comprises steps of:
   computing an instruction threshold to identify slots that are accessed enough to potentially incur cache pressure;
   checking a max residency of the identified slots; and
   in response to the max residency reaches the instruction threshold of total counts at the identified slot, incrementing an estimated occupancy at this slot by 1, wherein the instruction threshold preferably is a ratio of a residency to a total instruction count at a slot that is considered long enough to occupy a cache line.

* * * * *